(12) United States Patent
Hegde

(10) Patent No.: US 7,164,582 B2
(45) Date of Patent: Jan. 16, 2007

(54) COOLING SYSTEM WITH SUBMERGED FAN

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 313 days.

(21) Appl. No.: 10/978,023

(22) Filed: Oct. 29, 2004

(65) Prior Publication Data

US 2006/0092610 A1    May 4, 2006

(51) Int. Cl.
*H05K 7/20* (2006.01)
*H01L 23/34* (2006.01)
*F28F 7/00* (2006.01)

(52) U.S. Cl. ............... 361/697; 165/80.3; 165/121; 257/722; 361/703

(58) Field of Classification Search ........... 165/80.3, 165/121; 257/722; 361/697, 703
See application file for complete search history.

(56) References Cited

U.S. PATENT DOCUMENTS

| 5,288,203 | A |   | 2/1994 | Thomas |
|---|---|---|---|---|
| 5,734,553 | A | * | 3/1998 | Hong ..................... 361/697 |
| 6,109,340 | A |   | 8/2000 | Nakase et al. |
| 6,118,658 | A |   | 9/2000 | Nakase |
| 6,134,108 | A |   | 10/2000 | Patel et al. |
| 6,152,214 | A |   | 11/2000 | Wagner |
| 6,176,299 | B1 |   | 1/2001 | Hanzlik et al. |
| 6,206,087 | B1 |   | 3/2001 | Nakase et al. |
| 6,259,601 | B1 |   | 7/2001 | Jaggers et al. |
| 6,392,885 | B1 | * | 5/2002 | Lee et al. ................... 361/697 |
| 6,419,007 | B1 | * | 7/2002 | Ogawara et al. ........... 165/80.3 |
| D464,938 | S |   | 10/2002 | Hegde |
| 6,505,680 | B1 | * | 1/2003 | Hegde ..................... 165/80.3 |
| 6,508,300 | B1 |   | 1/2003 | Hegde |
| 6,520,250 | B1 | * | 2/2003 | Lee et al. ................... 165/121 |
| D471,523 | S |   | 3/2003 | Hegde |
| D471,881 | S |   | 3/2003 | Hegde |
| 6,543,522 | B1 |   | 4/2003 | Hegde |
| 6,631,756 | B1 | * | 10/2003 | Hegde ..................... 165/80.3 |
| 6,705,795 | B1 |   | 3/2004 | Hegde |
| 6,714,415 | B1 | * | 3/2004 | Shah ..................... 361/704 |
| 6,779,593 | B1 |   | 8/2004 | Hegde |
| 6,789,610 | B1 | * | 9/2004 | Hegde ................. 165/104.21 |
| 7,123,483 | B1 | * | 10/2006 | Otsuki et al. ............. 361/710 |
| 2004/0136160 | A1 | * | 7/2004 | Lee et al. ................... 361/697 |
| 2005/0088821 | A1 | * | 4/2005 | Lee et al. ................... 361/697 |
| 2005/0241800 | A1 | * | 11/2005 | Hegde ..................... 165/80.3 |

* cited by examiner

*Primary Examiner*—Greg Thompson

(57) ABSTRACT

A cooling system for dissipating heat from a component is disclosed. The cooling system includes a cooling device that includes a core and a plurality of spaced apart fins connected with the core with each fin including at least two vanes. A trailing edge of the fins define a chamber. A fan mount is connected with the vanes and supports a stator of a fan. A rotor connected with the stator includes a plurality of fan blades and the fan mount positions the stator over the chamber with the fan blades submerged in the chamber. A height of the cooling system is reduced because the fan does not include a housing and a substantial portion of the fan is positioned in the chamber. The submerged position of the fan blades allows for a high fan capacity with reduce air shock noise.

27 Claims, 21 Drawing Sheets

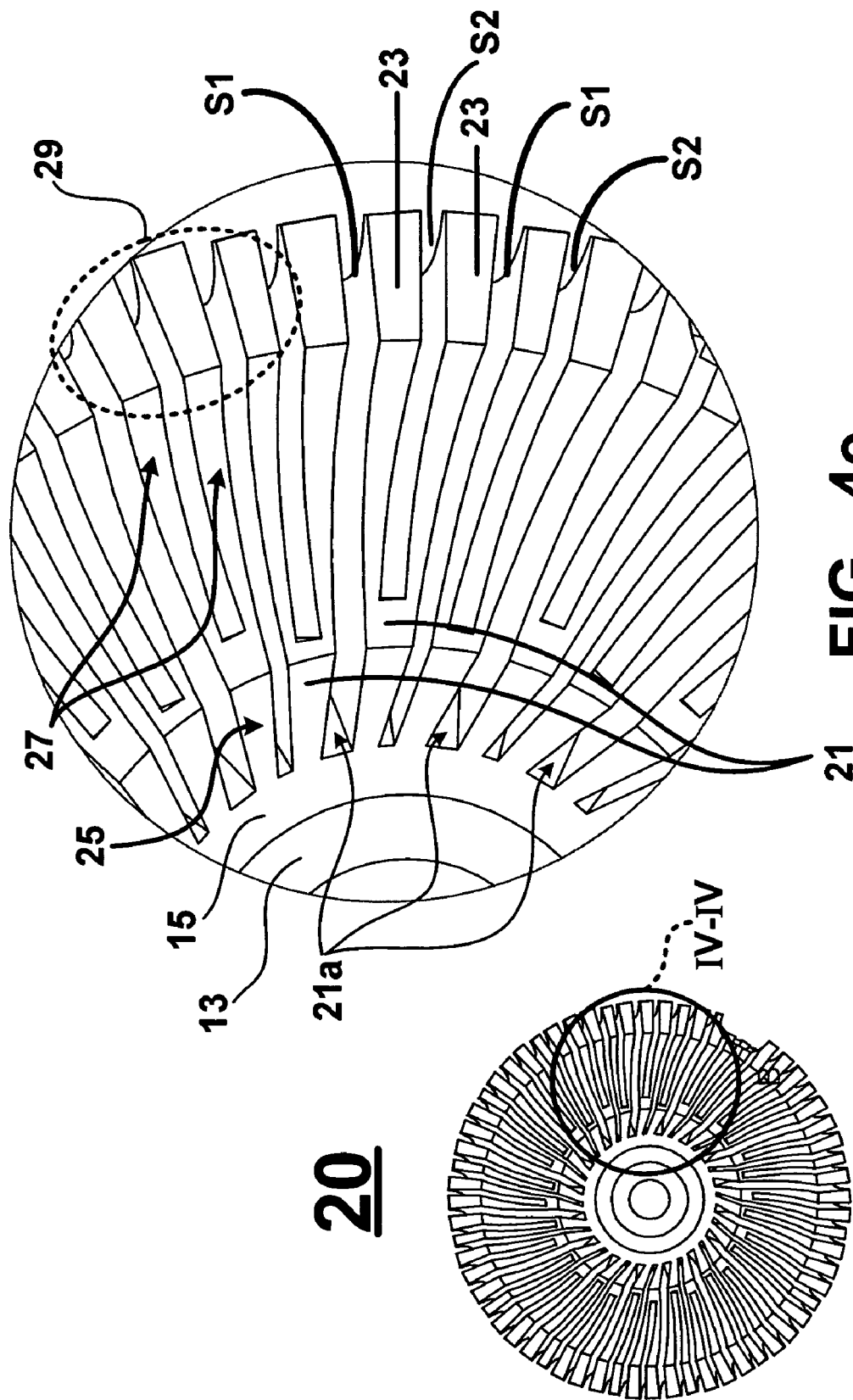

COOLING SYSTEM WITH SUBMERGED FAN

FIELD OF THE INVENTION

The present invention relates generally to a cooling system for dissipating heat from a component in thermal communication with the cooling system. More specifically, the present invention relates to a cooling system that includes a cooling device, a fan mount connected with the cooling device, and a fan without a housing and connected with the fan mount. The fan mount supports a stator of the fan over a chamber of the cooling device and positions fan blades of the fan in a chamber of the cooling device so that the fan blades are either completely or partially submerged in the chamber.

BACKGROUND OF THE INVENTION

It is well known in the electronics art to place a heat sink in contact with an electronic device so that waste heat generated by operation of the electronic device is thermally transferred to the heat sink to cool the electronic device. However, with continued increases in areal densities and system clock speeds in electronic devices, such as microprocessors (CPU's), digital signal processors (DSP's), and application specific integrated circuits (ASIC), the amount of waste heat generated by those electronic devices and the operating temperature of those electronic devices are directly proportional to clock speed and device geometries. Efficient operation of a CPU as well as other high power dissipation electronic devices requires that waste heat be continuously and effectively removed.

However, as the aforementioned areal densities and system clock speeds of electronic devices continue to increase, a heat flux of the electronic devices also increases. Although air cooled heat sinks are commonly used to dissipate waste heat from the aforementioned electronic devices, the increased heat flux in high performance electronic devices is often concentrated in a small area, usually on a package surface that will be placed in thermal contact with the heat sink. The ability to effectively dissipate ever increasing levels of heat flux in high performance electronic devices has challenged current heat sink designs where the entire heat sink is fabricated using processes such as machining, forging, casting, and extrusion. Those processes make it difficult to increase the number of fins or an area of the fins in order to effectively dissipate heat flux concentration.

Heat flux is a thermal output per unit of area (i.e. $W/cm^2$). For example, if a total thermal output is 100 Watts over a heat source having dimensions of 3.5 cm*3.5 cm, then the heat flux is 100 W÷(3.5 cm*3.5 cm)=8.163 $W/cm^2$. At present, based on area and cost constraints, electronic device package size remains the same or decreases while the areal densities and clock speeds continue to increase. Consequently, the problems associated with heat flux concentration continue to increase and those problems cannot be solved solely by increasing heat sink size, the number of fins, fin surface area, or fan capacity.

Typically, waste heat from the heat mass is dissipated by an air flow through fins that are connected with the heat mass. However, with the increasing clock speeds and areal densities, a volume of an enclosure that houses the electronic device continues to decrease in many applications such as PC's, workstations, and servers, for example. Therefore, the aforementioned increases in heat sink size, the number of fins, fin surface area, or fan capacity are inconsistent with decreases in enclosure volume.

Turning to FIGS. 1a through 1d, a prior fan 500 for generating an air flow f to dissipate heat from a prior heat sink 550 includes a housing 501 and several apertures 504 for receiving a fastener (525, 526) (e.g. a nut and bolt) to mount the fan 500 on the heat sink 550. A component to be cooled (not shown) is placed in contact with a surface 519 of the prior heat sink 550. A prior mounting ring 521 can be used to mount the fan 500 over fins 551 of the heat sink 550. The fan 500 can include a stator 503 that is integrally formed with the housing 501 and a rotor 505 including several fan blades 507 is rotatably connected with the stator 503. The housing 501 has a thickness t, a width w, and a height h. The housing 501 serves as a shroud to protect the fan blades 507, as a platform for the stator 503, and as a frame to mount the fan 500 over the heat sink 550 such that a combined height $H_T$ of the combination (500, 521, 550) is t plus a height H1 (i.e. the combined height $H_T$=H1+t). Therefore, increases in fan capacity often requires a larger size fan to increase capacity in CFM or an increase in fan speed in RPM. Accordingly, a larger fan size can increase the thickness t with a resulting increase in the combined height $H_T$. In either case, the increased capacity comes at the expense of higher cost, increased fan noise, larger fan size, and increased energy consumption. Moreover, a larger size fan may not be possible if the combined height $H_T$ exceeds the design parameters for a given enclosure. Similarly, increasing a surface area of the fins 551, the number of fins 551, or a size of the heat sink 550 (e.g. the height H1 or a width W1) can result in increased cost, mass, and volume of the heat sink 550 and those increases may also exceed the design parameters for a given enclosure size.

Consequently, there is a need for a cooling system with increased fan capacity without increasing fan size or increasing fan noise. There is also a need for a cooling system with a fan with a reduced height so that the cooling system is smaller and can be accommodated in smaller enclosures. Finally, there exists a need for a cooling system with a fan that does not include a housing so that the fan has a small footprint, takes up less space, and can be flexibly positioned in a cooling device.

SUMMARY OF THE INVENTION

The cooling system of the present invention solves the aforementioned problems associated with reducing heat flux concentration. The cooling system includes a cooling device including a core and a plurality of fins connected with the core, a boss, a base, and a mounting surface for thermally connecting the core with a component to be cooled. The fins are spaced apart to define a first slot between adjacent fins. Each fin includes a leading edge and a trailing edge with the trailing edges of the fins defining a chamber. A second slot extends through a portion of each fin to define at least two vanes in each fin with each vane including a top face and a lip. The cooling system also includes a fan without a housing and including a stator, a rotor connected with the stator, a gap between the rotor and the stator, and a plurality of fan blades connected with the rotor. The fan generates a reverse air flow from the leading edges to the trailing edges of the fins or a forward air flow from the trailing edges to the leading edges of the fins. The cooling system further includes a fan mount for supporting the stator and for positioning the stator over the chamber so that the fan blades on the rotor are positioned in the chamber. The fan mount includes a vane clamp that connects with the top face and the lip of a plurality of the vanes and a platform connected with the vane clamp by a plurality of supports. The platform includes a stator clamp for connecting the stator with the platform. A portion of the stator clamp is positioned in the gap between the rotor and the stator.

Because the fan does not include a housing, some or all of the fan blades can be positioned in the chamber thereby reducing an overall height of the cooling system. The positioning of the fan blades in the chamber allows for an increase in fan capacity (i.e. in CFM) without excessive air shock noise when compared to prior fans with a housing that encloses the fan blades.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 4b and 4c are a cross-sectional views of a cooling device along a line I—I of FIG. 4a.

FIG. 4d is a top plan view of a cooling device.

FIG. 4e is a detailed view of a section IV—IV of FIG. 4d.

DETAILED DESCRIPTION

Figure 1A:
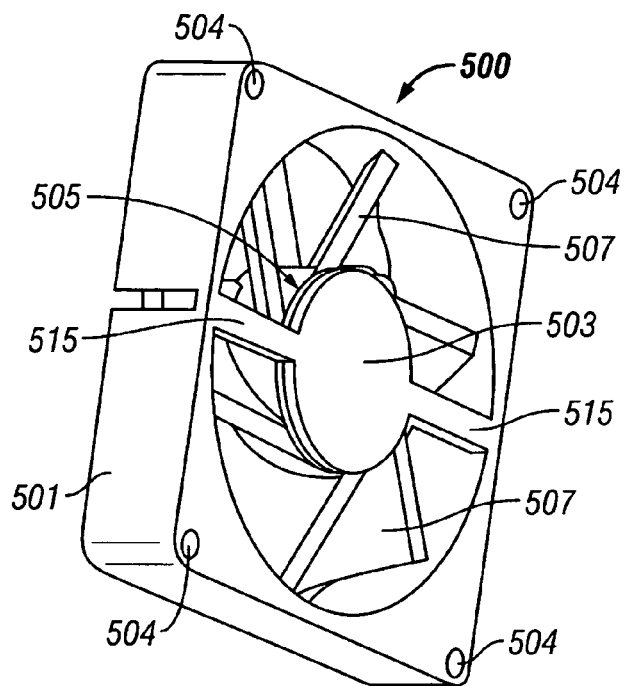
FIGS. 1a through 1c depict a prior fan with a housing.
Figure 1B:
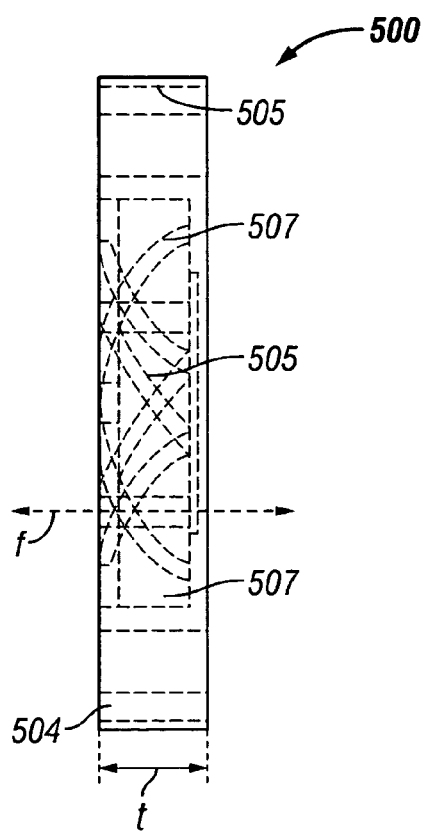
Figure 1C:
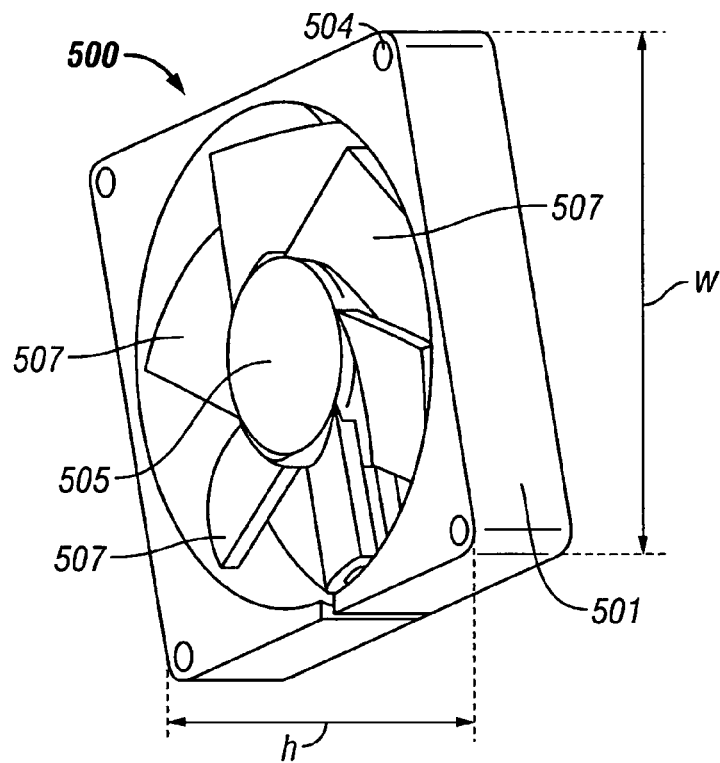
Figure 1D:
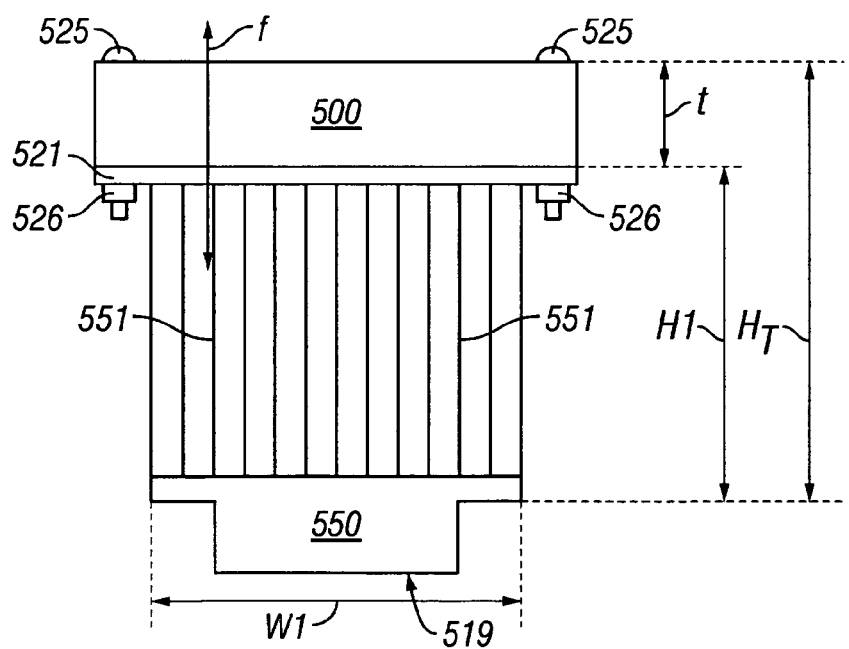
FIG. 1d is a side view depicting a prior fan with a housing mounted to a prior cooling device.

In the following detailed description and in the several figures of the drawings, like elements are identified with like reference numerals.

As shown in the drawings for purpose of illustration, the present invention is embodied in a cooling system for dissipating heat from a component. The cooling system includes a cooling device, a fan without a housing and for generating a reverse air flow or a forward air flow, and a fan mount. The cooling device includes a core and a plurality of fins connected with the core, a boss, a base, and a mounting surface for thermally connecting the core with a component to be cooled. The fins are spaced apart to define a first slot between adjacent fins and each fin includes a leading edge and a trailing edge with the trailing edges of the fins defining a chamber. Each fin also includes a second slot that extends through a portion of each fin to define at least two vanes in each fin with each vane including a top face and a lip.

The fan includes a stator, a rotor connected with the stator, a gap between the rotor and the stator, and a plurality of fan blades connected with the rotor. Unlike prior fans, the fan does not include a housing. The fan generates a reverse air flow from the leading edges to the trailing edges of the fins or a forward air flow from the trailing edges to the leading edges of the fins. The fan mount supports the stator and positions the stator over the chamber so that the fan blades on the rotor are positioned in the chamber. The fan mount includes a vane clamp that connects with the top face and the lip of a plurality of the vanes and a platform connected with the vane clamp by a plurality of supports. The platform also includes a stator clamp for connecting the stator with the platform. A portion of the stator clamp is positioned in the gap between the rotor and the stator.

Because the fan does not include a housing and because the rotor and fan blades are positioned in the chamber (i.e. are submerged), the combination of the fan mount and the fan results in a low height profile cooling system. In small form factor systems, the reduced height of the cooling system increase head clearance above the fan mount. The head clearance creates a gap between the top of the fan mount an enclosure that houses the cooling system. The gap allows air to flow into or out of the cooling system without interference or restrictions caused by a surface of the enclosure being to close to the fan. By submerging the fan blades, the fan can operate at higher RPM's and/or a size of the fan blades can be increased to increase a capacity of the fan (e.g in CFM). Heat flux concentrated proximate the base of the core is reduced by the increased fan capacity. Moreover, the submerged fan allows for an increased fan capacity at reduced levels of fan noise.

Figure 2A:
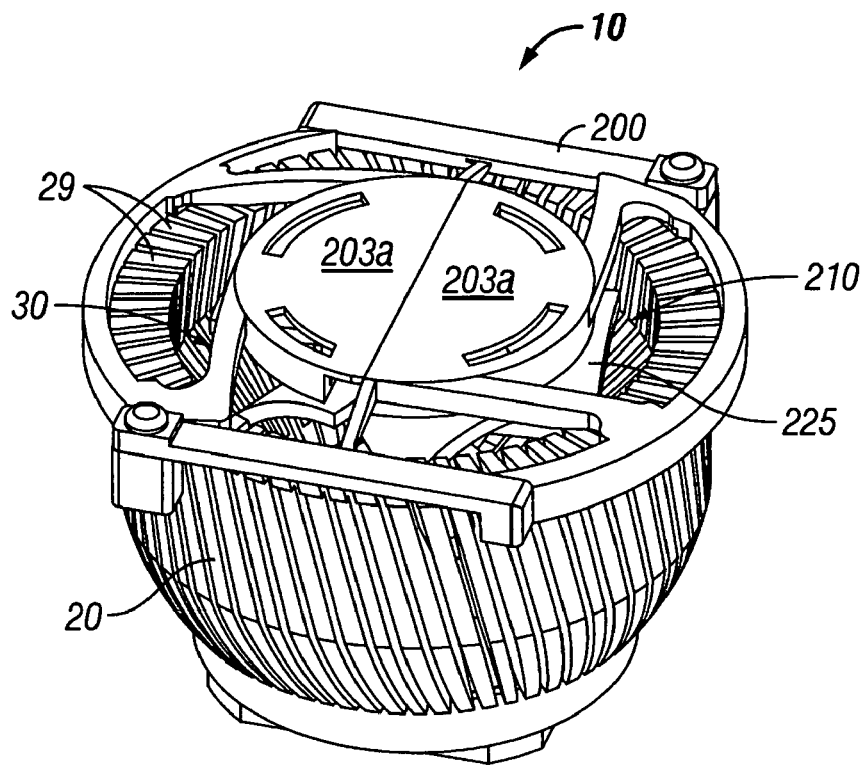
FIG. 2a is a top profile view depicting a cooling system.
Figure 2B:
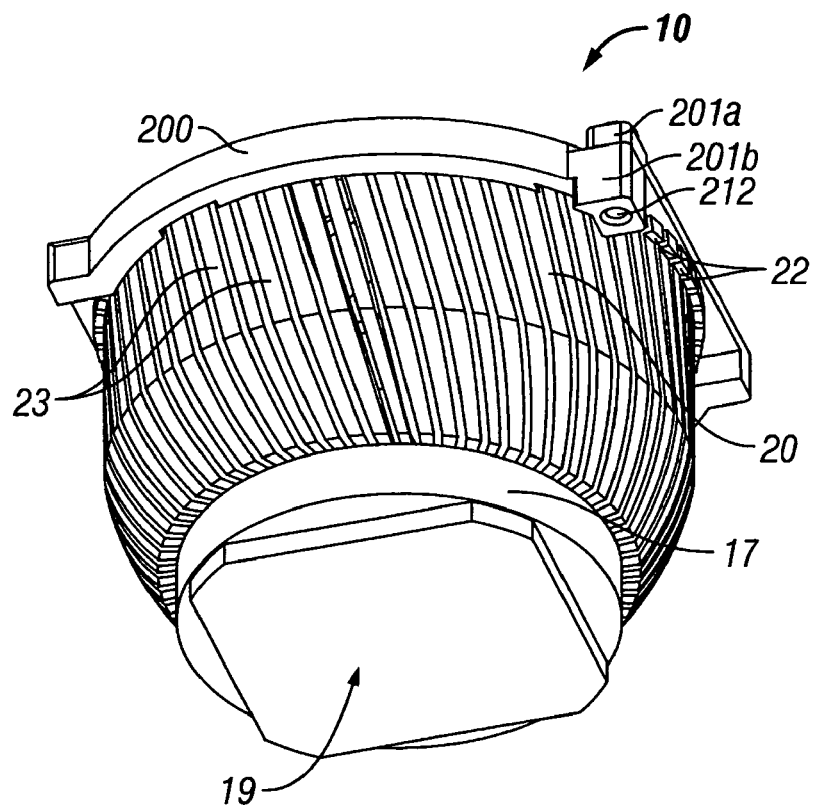
FIG. 2b is a bottom profile view depicting a cooling system.

Turning to FIGS. 2a and 2b, a cooling system 10 includes a cooling device 20, a fan 210, and a fan mount 200. The cooling system 10 can be used to dissipate heat from any component including but not limited to an electronic component. The fan 210 is submerged in a chamber 30 of the cooling device 20 such that a plurality of fan blades 225 connected to a rotor (not shown) of the fan 210 are positioned in the chamber 30. The fan 210 does not include a housing. A stator (not shown) of the fan 210 is supported by a platform 203 connected with the fan mount 200. The fan mount 200 is connected with a top face 29 and a lip 22 of a plurality of vanes 23 of the cooling device 20. The cooling device 20 includes a core (not shown) with the core including a base 17 and a mounting surface 19. Waste heat from a component to be cooled is thermally communicated to the core of the cooling device 20 through the mounting surface 19.

Figure 3:
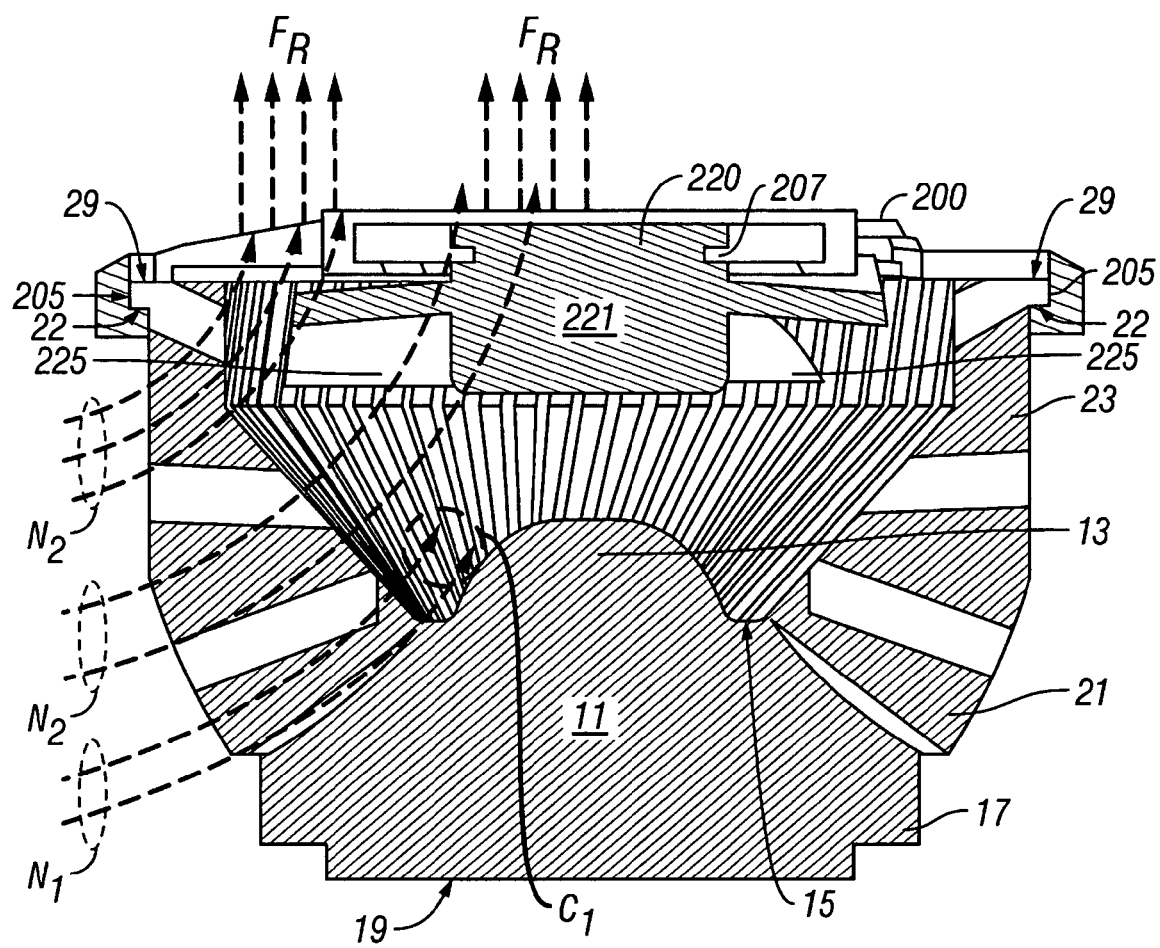
FIG. 3 is a cross-sectional view depicting a reverse air flow through a cooling system.
Figure 4A:
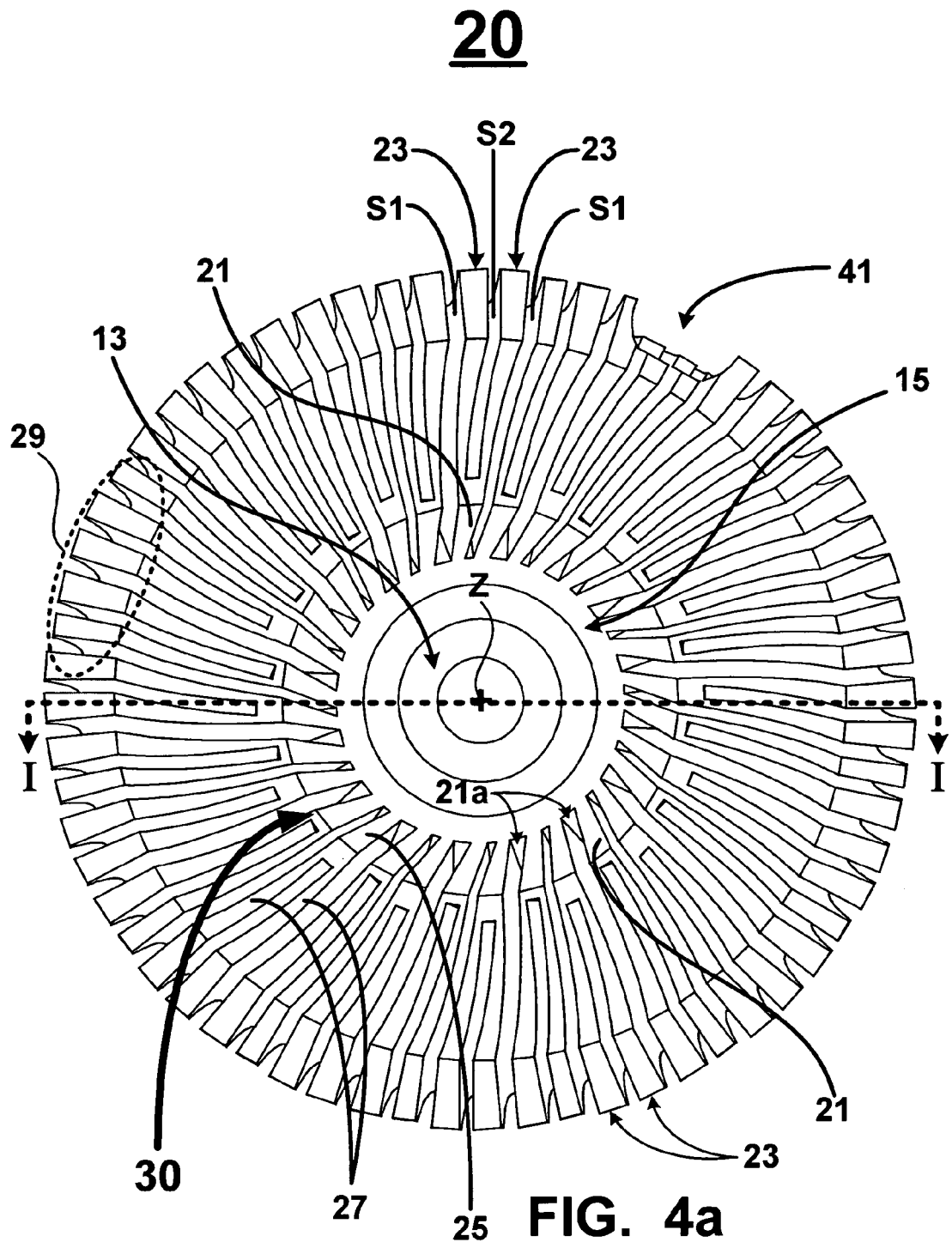
FIG. 4a is a top plan view depicting fins and vanes of a cooling device.
Figures 4B, 4C:
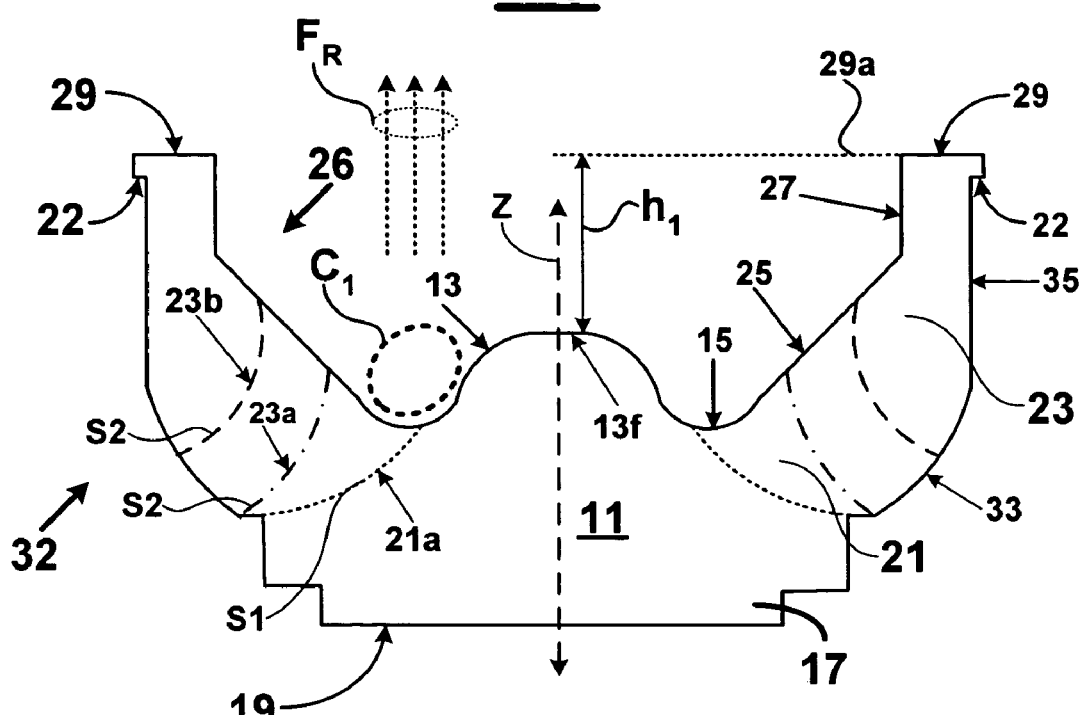

Referring to FIGS. 3, 4a, and 4b, the cooling device 20 includes a core 11 with a plurality of fins 21 connected with the core 11. The fins 21 are spaced apart from one another to define a first slot S1 between adjacent fins 21. The core 11 also includes a boss 13, a base 17, and a mounting surface 19. Preferably, the boss 13 is symmetrically disposed about an axis Z of the core 11. Waste heat from a component to be cooled is thermally communicated to the core 11 via the mounting surface 19 either by a direct contact between the component and the mounting surface 19 or through an intermediate structure as will be described below.

Each fin 21 includes a leading edge 32 and a trailing edge 26. The trailing edges 26 of the fins 21 define a chamber 30. Preferably, the chamber 30 is symmetrically disposed about the axis Z. Furthermore, each fin 21 includes a second slot S2 that extends through a portion of each fin 21 to define a plurality of vanes 23 in each fin 21. Each vane 23 includes a top face 29 and a lip 22. The lip 22 extends outward of the leading edge 32. The top face 29 and the lip 22 have a profile that complements a profile of a groove 205 of a vane clamp 201 as will be described below.

In FIG. 4a, looking into the chamber 30, the chamber 30 is symmetrically disposed around the axis Z and the chamber 30 symmetrically surrounds the boss 13. The boss 13 is an exposed portion of the core 11 and a surface area of the boss 13 is exposed to a portion of an air flow in the chamber 30 and aids in dissipating heat from the core 11. The boss 13 can include a groove 15 that blends a profile of the boss 13 with a profile of the trailing edge 26 of the fins 21. The boss 13 and the groove 15 can have a surface profile including but not limited to a sloped profile, an arcuate profile, or a composite profile that is combination of the aforementioned profiles. The surface profile of the boss 13 can include a frustum 13f (see FIG. 4b). Moreover, the surface profile of the boss 13 can include a convex or concave shape. Preferably, the boss 13 has a convex shape so that the boss 13 extends into the chamber 30 along the axis Z where an air flow in the chamber 30 can circulate over the boss 13 and dissipate waste heat from the core 11. The groove 15 can also include a convex or concave shape.

Turning to FIG. 4b, a cross-sectional view of the cooling device 20 along a line I—I of FIG. 4a depicts the core 11 including the boss 13 extending into the chamber 30 along the axis Z. The fins 21 include a leading edge 32 and a trailing edge 26. The leading and trailing edges (32, 26) can be surfaces with complex profiles including but not limited to planar profiles (e.g. a straight profile), arcuate profiles, slope profiles, and a composite profile that includes any one or more of the aforementioned profiles. The trailing edges 26 of the fins 21 define the chamber 30 and the trailing edges 26 can include a section 27 having a first profile (e.g. a planar profile) and a section 25 having a second profile (e.g. a sloped profile). The groove 15 can have a profile that blends with the profiles of the boss 13 and the trailing edges 26. For example, the groove 15 can have an arcuate shape that blends with an arcuate shape of the boss 13 and a slope profile of the section 25. The trailing edge 26 can include more than the two sections (25, 27) depicted herein and the sections can have any of the aforementioned surface profiles.

Referring to FIG. 4c, at least a portion of the trailing edges 26 of the fins 21 can include a profile that compliments a profile of an outer edge 226 of fan blades 225 of a fan 210. For purposes of illustration, a fan mount that supports and positions the fan 210 over the chamber 30 is not depicted in FIG. 4c. The fan blades 225 are connected with a rotor 221 which is rotatably mounted with a stator 220 of the fan 210 for generating an air flow as will be described below. For example, the outer edges 226 of the fan blades 225 can have a planar profile and the first profile of the section 27 can also have a planar profile that complement the profile of the outer edges 226. The complementary profiles of the trailing edges 26 and the outer edges 226 need not be planar profiles and can include but are not limited to sloped profiles, arcuate profiles, and a composite profile that includes any one or more of the aforementioned profiles. The profile of the outer edges 226 can complement the profiles or more than one section of the trailing edge 26. For instance the outer edges 226 can have a profile that complements a portion of the section 27 and a portion of the section 25.

The stator 220 is supported by a fan mount (not shown) as will be described below and a platform of the fan mount connects with the stator 220 using a stator clamp. A portion of the stator clamp is positioned in a gap 223g between the rotor 221 and the stator 220. The fan mount includes a vane clamp that connects with the top face 29 and the lip 22 and the fan mount positions the stator 220 over the chamber 30 so that the fan blades 225 are positioned in the chamber 30. Preferably, the fan blades 225 are positioned entirely within the chamber 30, that is, they are completely submerged in the chamber 30.

In FIG. 4c, the fan blades 225 are positioned below a line 29a that is coplanar with the top face 29 of the vanes 23 such that the fan blades 225 are completely submerged in the chamber 30. However, the fan blades 225 can be partially submerged in the chamber 30 with a portion of the fan blades 225 positioned above the top face 29 (i.e. above the line 29a). For example, if the fan blades 225 have a thickness $t_b$, then 10% of the thickness $t_b$ can be positioned above the line 29a.

In FIGS. 4b and 4c, the first slot S1 can include a profile 21a. Preferably, the first slot S1 extends all the way to the core 11 so that an air flow passes over the core 11 and contributes to waste heat dissipation from the core 11. The profile 21a can include but is not limited to an arcuate profile and a sloped profile. Similarly, the second slot S2 can include a profile 23b. The profile 23b can extend through a portion of the fin 21 to form the vanes 23. On the other hand, the second slot S2 can include a profile 23a that extends all the way to the core 11 for the same reasons set forth above for the profile 21a, that is, to aid in waste heat dissipation from the core 11. The profiles (23a, 23b) can include but are not limited to an arcuate profile and a sloped profile.

Turning to FIG. 4e, an enlarged view of a section IV—IV of FIG. 4d depicts the profile 21a of the first slot S1 extending to the core 11 of which the boss 13 and the groove 15 are a portion of. Furthermore, FIG. 4e depicts how the various sections (25, 27) of the fins 21 blend with the profiles of the boss 13 and the groove 15. For instance, the section 27 has an arcuate profile that blends with a sloped profile of the section 25 which blends with a concave arcuate profile of the groove 15 which in turn blends with a convex arcuate profile of the boss 13. The aforementioned profiles can be selected to aerodynamically shape the reverse air flow through the chamber 30 or a forward air flow through the chamber 30.

Figure 5:
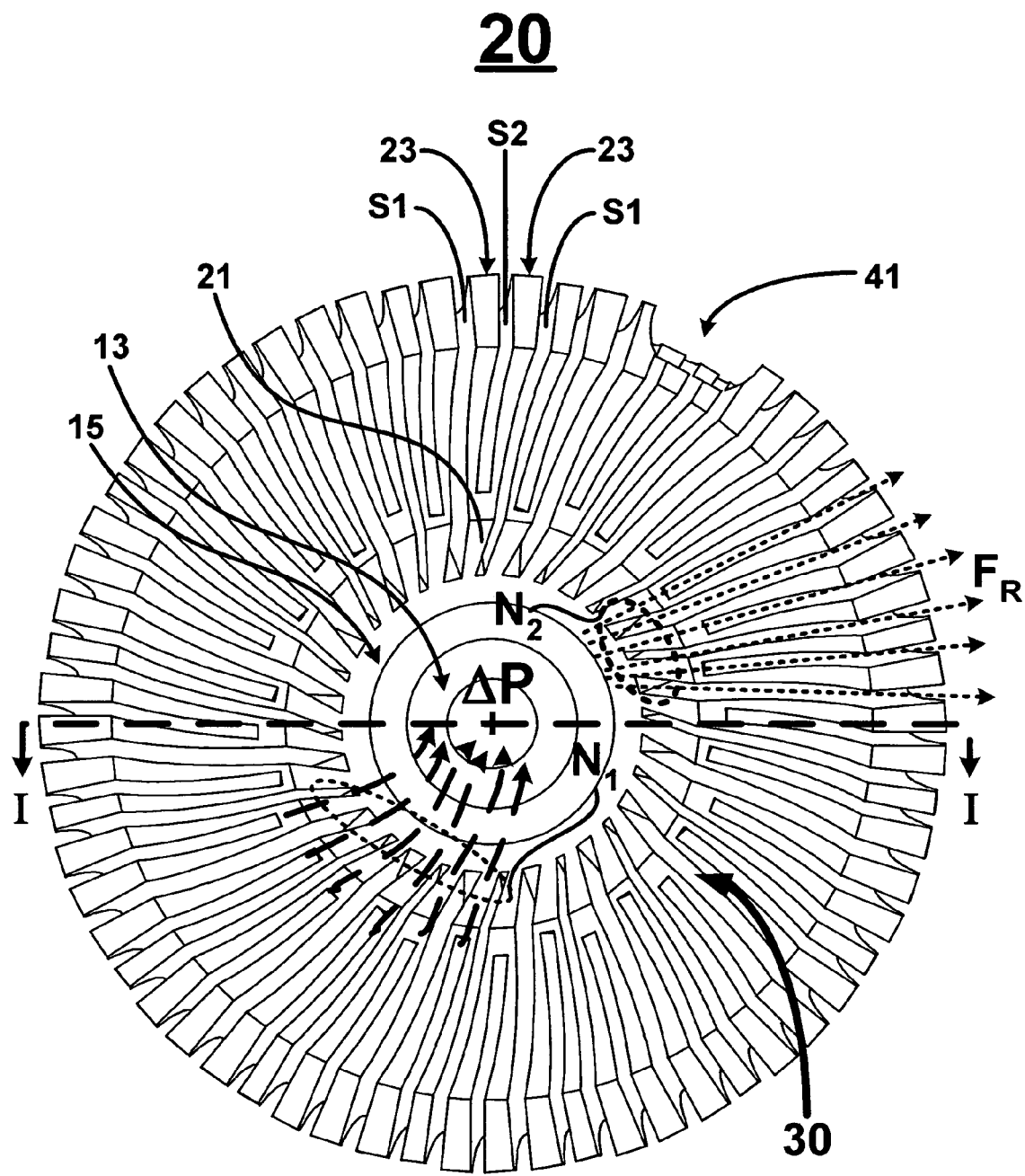
FIG. 5 is a top plan view depicting a reserve air flow through a cooling device.

Referring to FIGS. 3, 4b, and 5, a reverse air flow $F_R$ generated by the fan 210 is depicted. A portion of the reverse air flow $F_R$ is drawn into the chamber 30 (i.e. is sucked into the chamber 30) through a path $N_2$ where the reverse air flow $F_R$ flows through the slots (S1, S2) and passes over the fins 21, the vanes 23, and the core 11 to dissipate waste heat from the core 11. The reverse air flow $F_R$ creates a low pressure region $\Delta P$ in the chamber 30 between the boss 13 and the fins 21 as denoted by a region $C_1$. Additional air is drawn into the region $C_1$ via a path $N_1$ through the first slot S1. As the air passes through the first slot S1 it dissipates heat from the core 11. Moreover, the air in the region $C_1$ circulates over the boss 13 and the fins 21 to dissipate heat from the core 11.

Figure 3A:
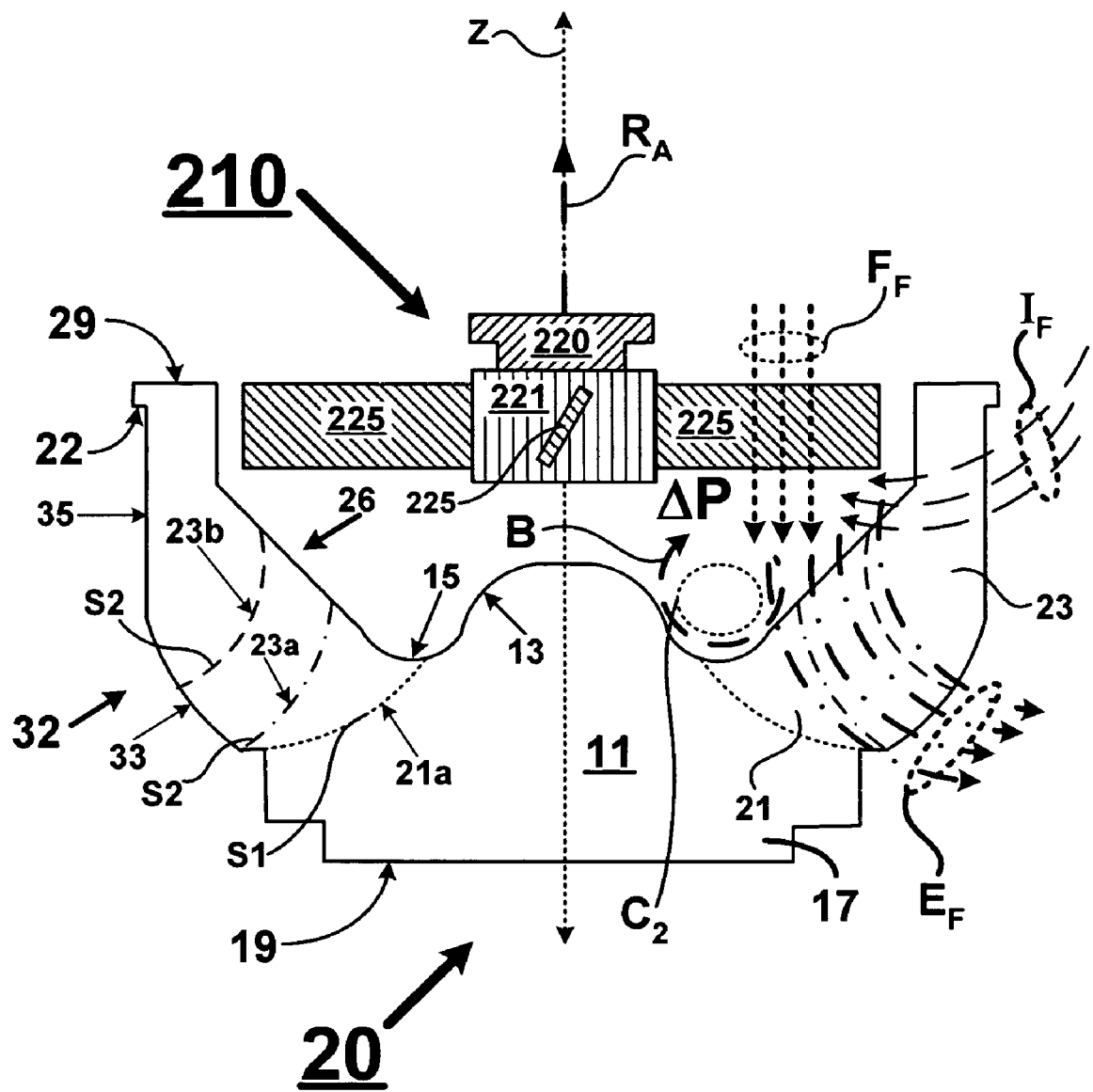
FIG. 3a is a cross-sectional view depicting a forward air flow through a cooling system.

Alternatively, in FIG. 3a, a forward air flow $F_F$ generated by the fan 210 is depicted. For purposes of illustration, a fan mount that supports and positions the fan 210 over the chamber 30 is not depicted in FIG. 3a. A portion of the forward air flow $F_F$ enters the chamber 30 and exits the chamber 30 through the slots (S1, S2) as an exhaust flow $E_F$. The forward air flow $F_F$ creates a low pressure region $\Delta P$ in the chamber 30 between the boss 13 and the fins 21 as denoted by a region $C_2$. The low pressure region $\Delta P$ creates an intake flow $I_F$ through the slots S2 and into the chamber 30. Both the intake and exhaust flows ($I_F$, $E_F$) pass over the fins 21, the vanes 23, and the core 11 to dissipate waste heat from the core 11. Additionally, the low pressure region $\Delta P$ creates an air flow B in the region $C_2$ that circulates over the boss 13 and the fins 21 and dissipates waste heat from the core 11.

Figure 6:
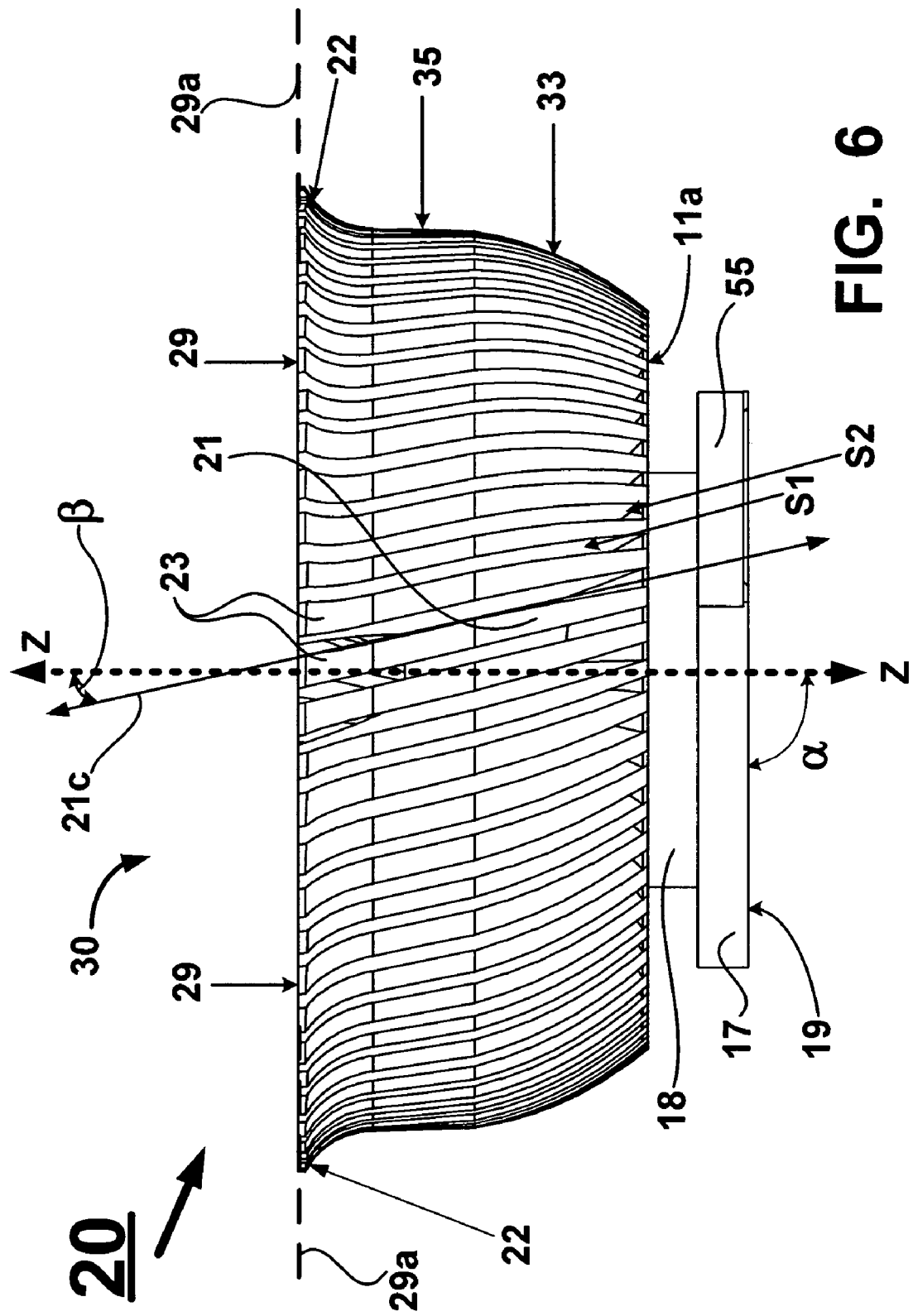
FIG. 6 is a side plan view of a cooling device with fins inclined at an angle.

The fins 21 can be inclined at an angle with respect to the axis Z. Accordingly, in FIG. 6, the fins 21 of the cooling device 20 can be inclined at an angle $\beta$ measured between a line 21c and the axis Z. The line 21c is measured along the first slot S1 of the vanes 23. The inclination of the angle $\beta$ includes but is not limited to a range from about 0 (zero) degrees to about 25.0 degrees. The angle $\beta$ can be selected to substantially match or closely approximate a pitch angle $\theta$ of the fan blades 225 as depicted in FIG. 4c. On the other hand, the angle $\beta$ can be selected to be within a predetermined range of the pitch angle $\theta$. As one example, the pitch angle $\theta$ can be about 15.0 degrees and the angle $\beta$ can be about 17.0 degrees.

Figure 7:
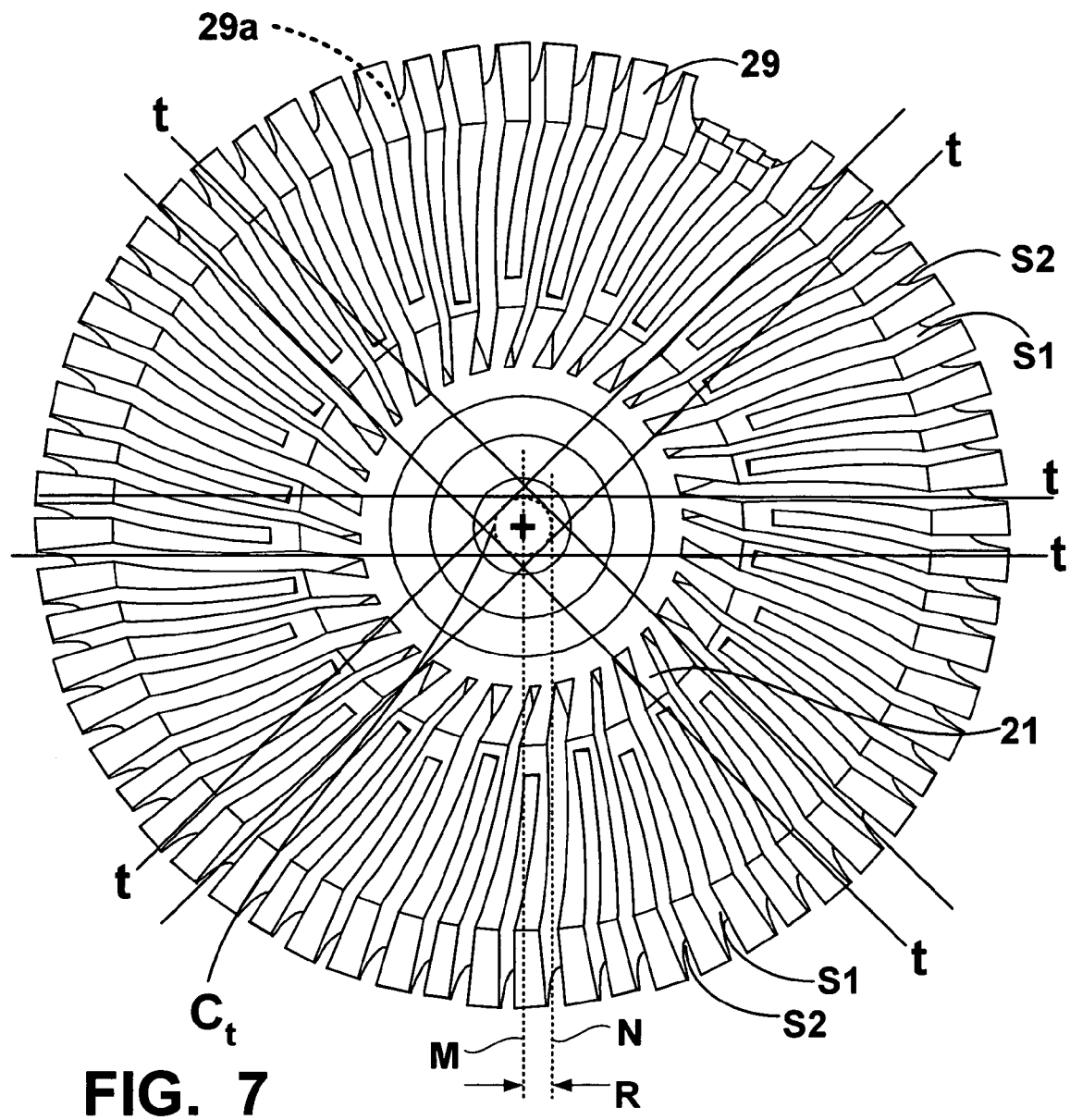
FIG. 7 is a top plan view depicting a tangential orientation of fins of a cooling device.

Turning to FIG. 7, the fins 21 can include a tangential orientation with respect to a circle $C_t$ (shown in dashed line) centered about the axis Z (denoted as a "+") and having a predetermined diameter. For example, the tangential orientation of the fins 21 is illustrated by a plurality of the fins 21 having tangent lines t drawn through their the first slots S1 and tangentially crossing a perimeter of the circle $C_t$. A line M through the axis Z and a parallel line N that also is tangential to the circle $C_t$ define a radius R therebetween and the predetermined diameter of the circle $C_t$ is two times the radius R (that is: $C_t=2*R$). The predetermined diameter includes but is not limited to a range from about 3.0 mm to about 12.0 mm.

The tangential orientation of the fins 21 can be determined by several factors. A first factor is a height $h_1$ from the top of the boss 13 to the top face 29 (see FIG. 4b). For example, when the height $h_1$ is about 7.5 mm, the vanes 21 can be tangential to the circle $C_t$ having a diameter of about 6.5 mm. On the other hand, a second factor is a height $h_2$ from the top of the boss 13 to a bottom of the fan blades 225 (see FIG. 4c). For instance, the diameter of the circle $C_t$ can be from about 3.0 mm to about 12.0 millimeters when the height $h_2$ varies from about 2.0 mm to about 8.5 mm. The above are examples only and the heights ($h_1$, $h_2$) are not to be construed as being limited to the ranges set forth above.

One advantage of the cooling system 10 is that the aforementioned tangential orientation and angular inclination of the vanes 21 and the profiles of the sections (25, 27) of the trailing edge 26 provide a low resistance path to the air flows ($F_R$, $F_F$) through the cooling device 20. The low resistance path results in a lower back pressure (i.e. a resistance to air flow). Consequently, air turbulence is reduced with a resulting reduction in fan noise.

Figure 8:
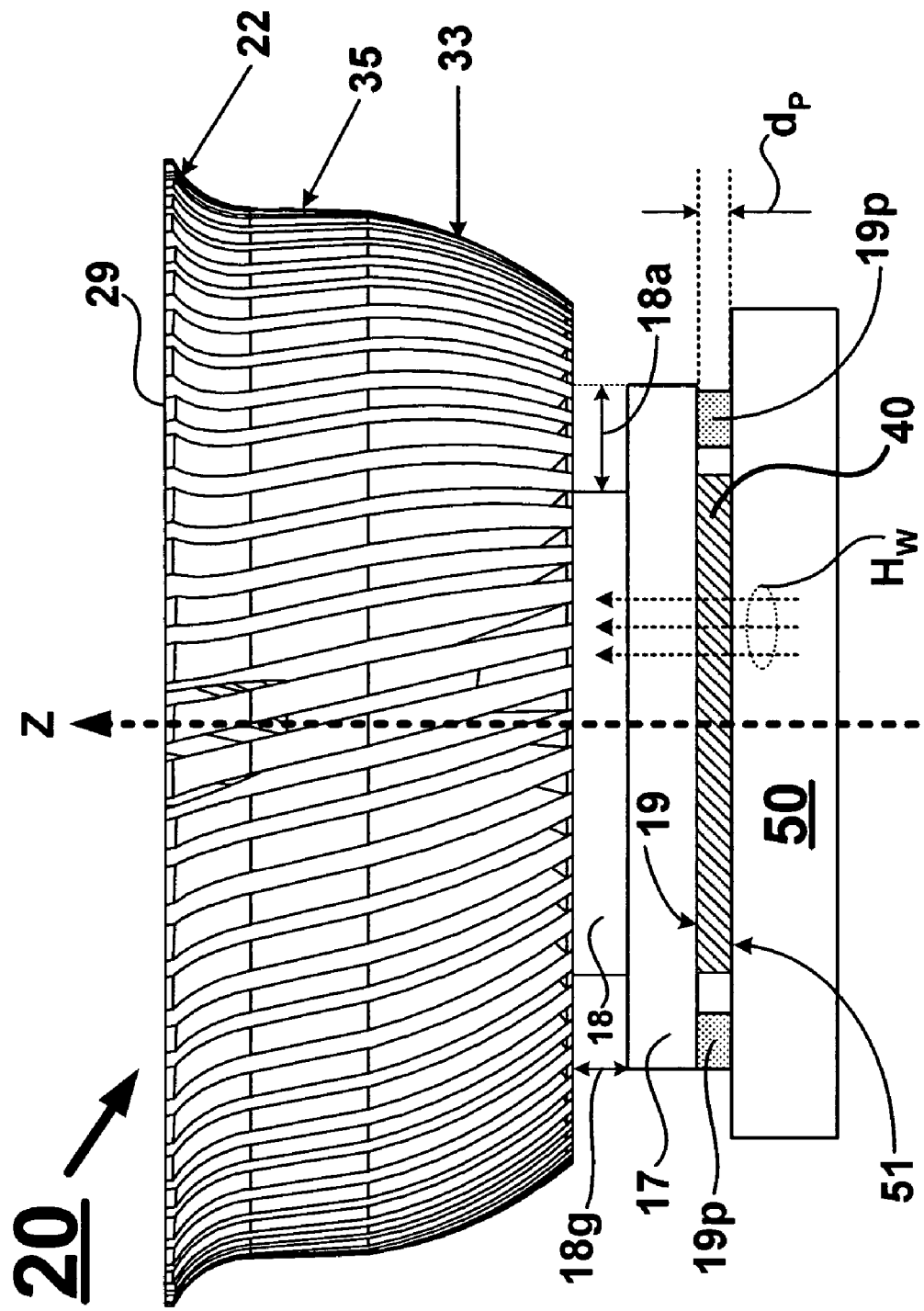
FIG. 8 is a side plan view of a cooling device and depicts a base including a plurality of projections.

In FIG. 8 and in FIGS. 9a through 9d, the base 17 of the cooling device 12 can include at least two projections 19p that extend outward of the mounting surface 19. A thermal interface material 40 can be positioned between the projections 19p and in contact with the mounting surface 19. The projections 19p protect the thermal interface material 40 from damage when the base 17 is urged into contact with a component 50 or from damage during manufacturing, transit, and handling of the cooling device 20 or the cooling system 10. The thermal interface material 40 is in contact with a surface 51 of the component 50 and the thermal interface material 40 provides a low thermal resistance path for the waste heat $H_W$ from the component 50 to be efficiently communicated to the mounting surface 19 and into the core 11. The projections 19p prevent the thermal interface material 40 from being crushed, deformed, or otherwise damaged by mounting the cooling device 20 on the component 50 and/or during manufacturing, transit, and handling. The projections 19p can extend outward of the mounting surface 19 by a distance $d_p$. The distance $d_p$ can be from about 0.2 millimeters to about 1.0 millimeters. Preferably, the mounting surface 19 is a substantially planar surface (i.e. it is substantially flat) and the mounting surface 19 is substantially perpendicular to the axis Z (i.e. about 90.0 degrees, see an angle $\alpha$ with the axis Z in FIG. 6).

Additional benefits of the thermal interface material 40 is that it seals micro voids (i.e. gaps) between the mounting surface 19 and the surface 51 thereby enhancing thermal transfer from the component 50 to the cooling device 20. Suitable materials for the thermal interface material 40 include but are not limited to a thermally conductive paste, a thermally conductive grease, silicone, paraffin, a phase transition material, graphite, a coated aluminum foil, and carbon fiber. For example, the thermal interface material 40 can be screen printed or pasted to the mounting surface 19.

Figure 9B:
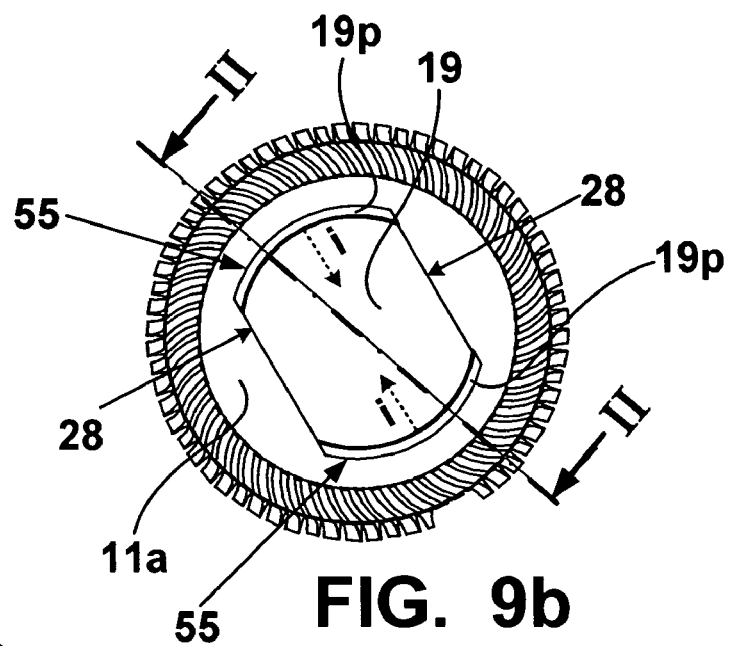
FIGS. 9a and 9b are side and bottom profile views respectively of a base including a plurality of projections.
Figure 9C:
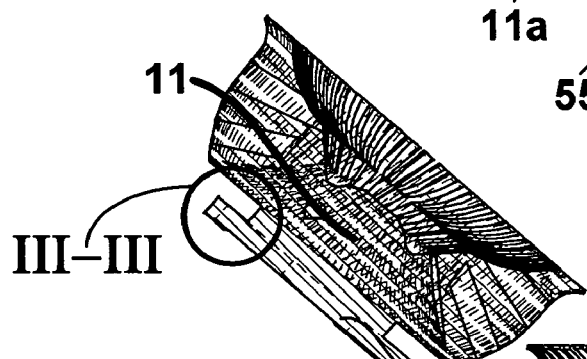
FIG. 9c is a cross-sectional view along a line II—II of FIG. 9b and depicts a cooling device including a plurality of projections.
Figure 9A:
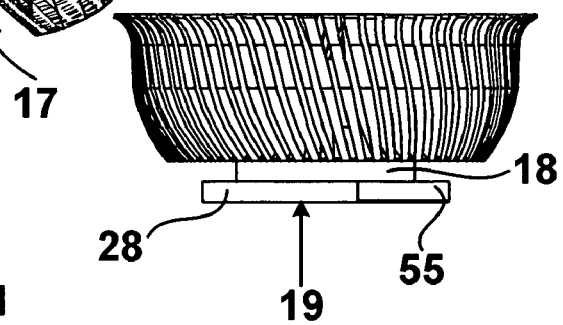
Figure 9D:
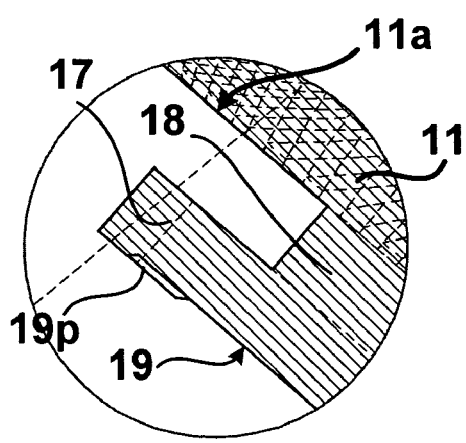
FIG. 9d is a detailed view of a projection from a section III—III in FIG. 9c.

In FIG. 8 and FIGS. 9a through 9d, the base 17 of the cooling device 20 can include a neck 18 that is inset 18a from the base 17 to define an attachment groove 18g between the base 17 and the core 11. The attachment groove 18g can be used to connect the cooling device 20 to a latch plate or the like that mounts the cooling device 20 to the component 50. The base 17 can also include a pair of flats 28 that are positioned substantially perpendicular to the mounting surface 19 and positioned in parallel opposition to each other. In FIGS. 9a and 9b, the base 17 can have a cylindrical or elliptical shape 55 with the flats 28 formed on opposing sides of the base 17 (see FIG. 9b). The aforementioned projections 19p can have an arcuate shape that complements the cylindrical shape 55; however, the projections 19p can have any shape including a linear shape. The flats 28 can be formed using conventional machining processes such as milling, for example. The projections 19p can be positioned proximate the edges of the base 17 as shown in FIGS. 9b and 9d, or the projections 19p can be inset i (see dashed arrows) from the edges as depicted in FIG. 9b.

Referring to FIG. 9d, an enlarged view of a section III—III of FIG. 9c depicts the base 17, the neck 18, and the projections 19p. The projections 19p extend slightly outward of the mounting surface 19; however, the distance $d_p$ for the projections 19p will depend on factors including the thickness of the thermal interface material 40. The projections 19p can be formed using conventional machining processes such as milling or the projections can be formed during a casting or forging process and then machined to tolerance.

Figure 10:
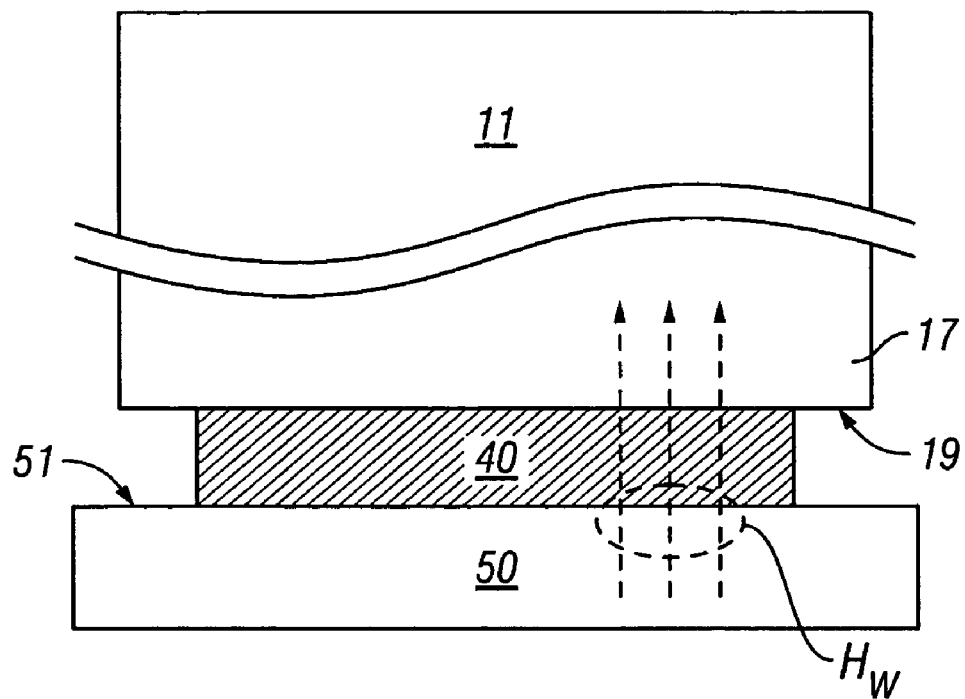
FIG. 10 is a cross-sectional view depicting a thermal interface material in contact with a mounting surface.

In FIG. 10, the aforementioned thermal interface material 40 can be positioned on the mounting surface 19 so that the waste heat $H_W$ from the component 50 is efficiently thermally communicated from the surface 51 of the component 50 to the mounting surface 19 and into the core 11. Accordingly, in FIG. 10, the thermal interface material 40 serves as an intermediate structure between the component 50 and the core 11.

Figure 11:
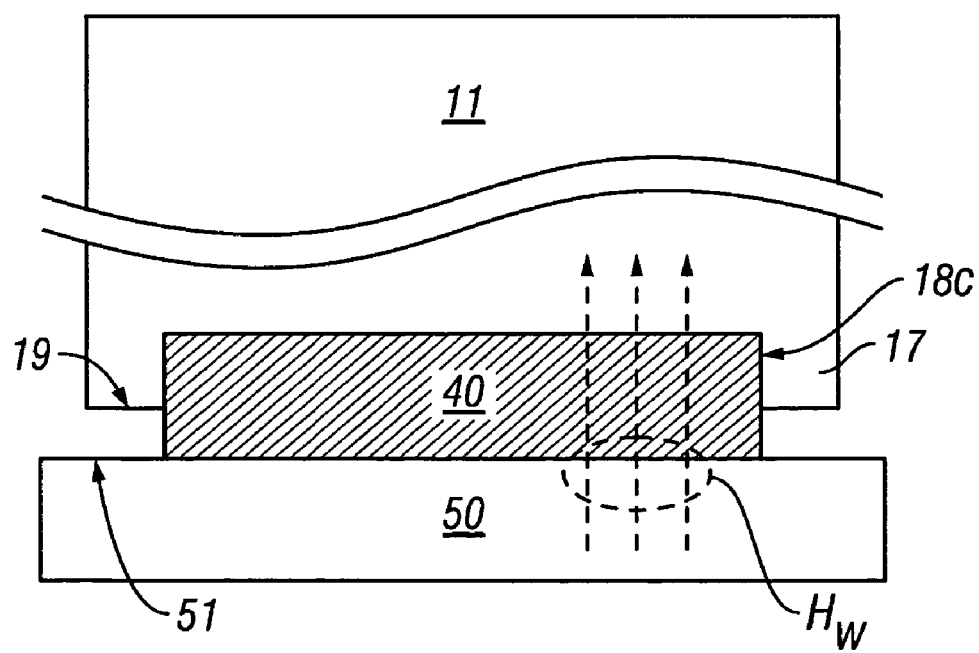
FIG. 11 is a cross-sectional view depicting a thermal interface material positioned in a cavity.

Alternatively, in FIG. 11, the mounting surface 19 can include a cavity 18c that is inset from the mounting surface 19 and designed to accommodate the thermal interface material 40. The thermal interface material 40 can be positioned in the cavity 18c and may be flush with the mounting surface 19, inset from the mounting surface 19, or extend outward of the mounting surface 19 as depicted in FIG. 11. In FIGS. 10 and 11, the cooling system 10 can include the thermal interface material 40 or the thermal interface material 40 can be connected with the mounting surface 19 or positioned in the cavity 18c prior to mounting the cooling system 10 with the component 50.

Figure 12:
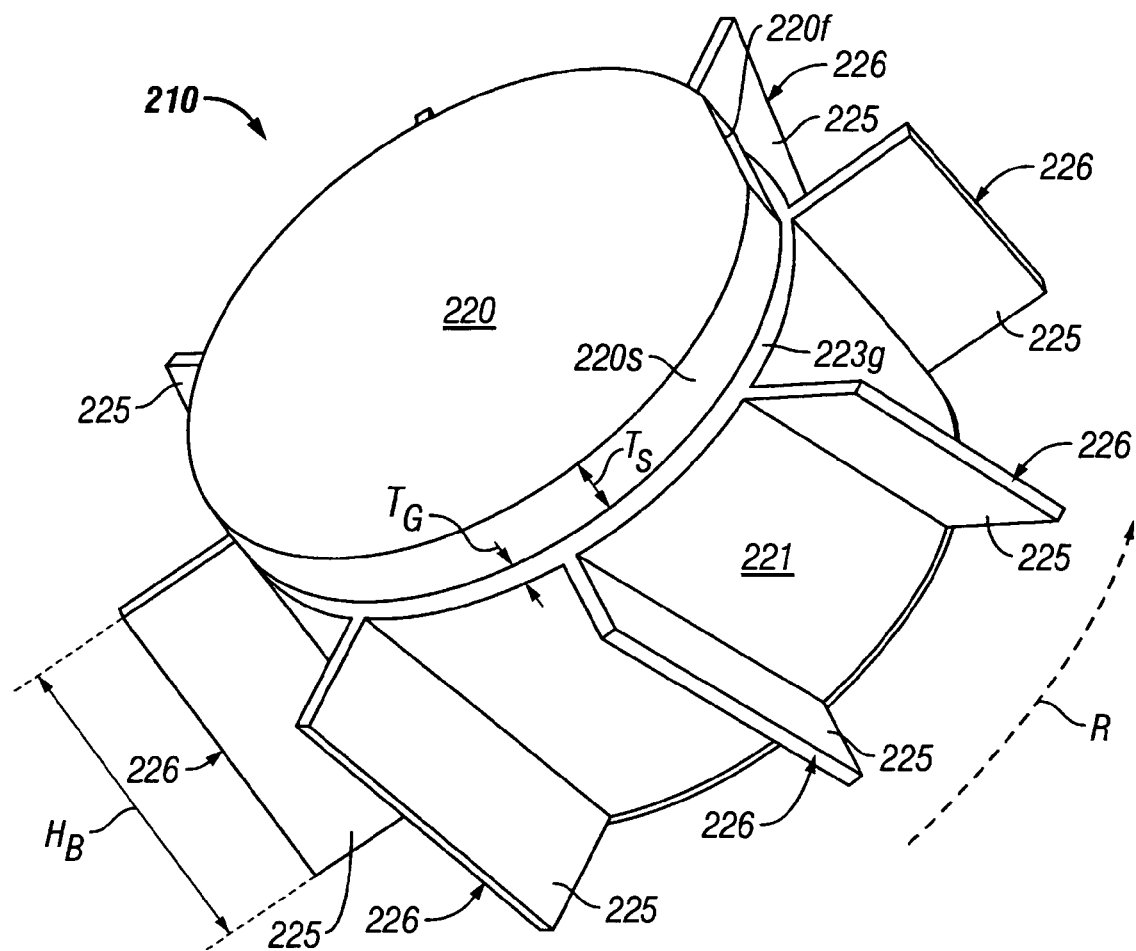
FIG. 12 is a profile view depicting a fan without a housing.

In FIG. 12 a fan 210 for generating the air flows ($F_R$, $F_F$) includes a stator 220, a rotor 221 that is connected with the stator 220, and a plurality of fan blades 225 connected with the rotor 221. The rotor 221 is rotatably mounted to the stator 220 and rotates R in a direction so that the fan blades 225 generate the air flows ($F_R$, $F_F$). The stator 220 can include a flat portion 220f. The flat portion 220f is optional, but can be used to key (i.e. align) the stator 220 in a platform of a fan mount to be described below. The flat portion 220f can also prevent a rotation of the stator 220 when mounted in the platform.

A gap 223g between the stator 220 and the rotor 221 has a thickness $T_G$ selected to allow a portion of a stator clamp (not shown) to be positioned in the gap 223g when the stator 220 is connected with a platform to be described below. As was described above, an outer edge 226 of the fan blades 225 can complement a profile of at least a portion of the trailing edges 26 of the fins 21. The stator 220 can include a surface 220s with a thickness $T_S$ and a profile selected to complement a profile of a groove in the platform so that the stator clamp is positioned in the gap 223g and under the stator 220 with the surface 220s positioned in the groove. The profile of the surface 220s need not be planar as depicted and can include but is not limited to a sloped profile and an arcuate profile.

Those skilled in the electronics art will appreciate that the fan 210 can be an electrically powered fan that operates off of an AC or a DC power source that is in electrical communication with the fan 210. Unlike prior fans, the fan 210 does not include a housing. Accordingly, the stator 220 is connected with the platform to securely hold the stator 220 during operation of the fan 210. A height $H_B$ of the fan blades 225 should be selected so that the fan blades 225 don't come into contact with the fins 21, the vanes 23, or the boss 13 when the fan blades 225 are positioned in the chamber 30.

Figure 13A:
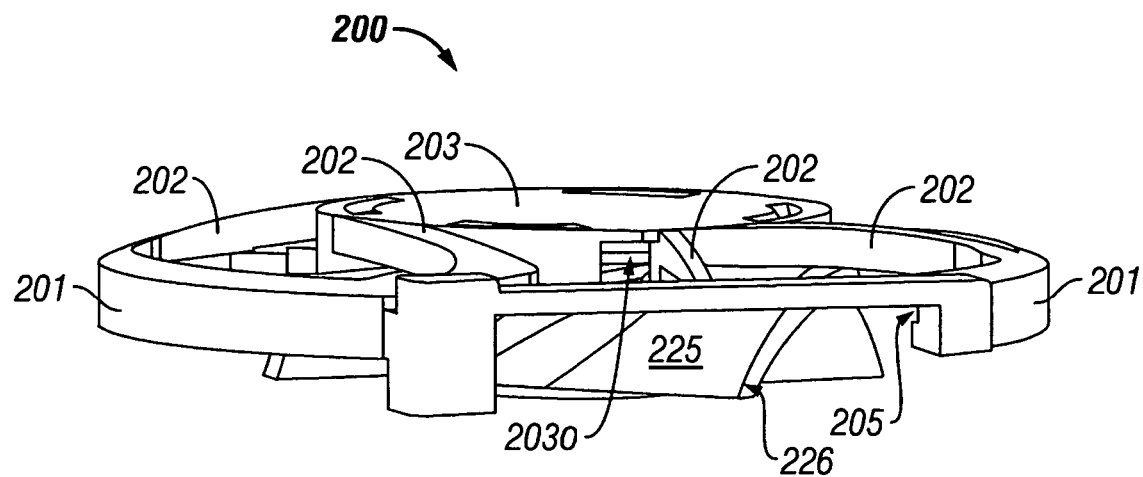
FIGS. 13a through 13c are side, top, and bottom profile views respectively depicting the fan of FIG. 12 connected with a fan mount.
Figure 13B:
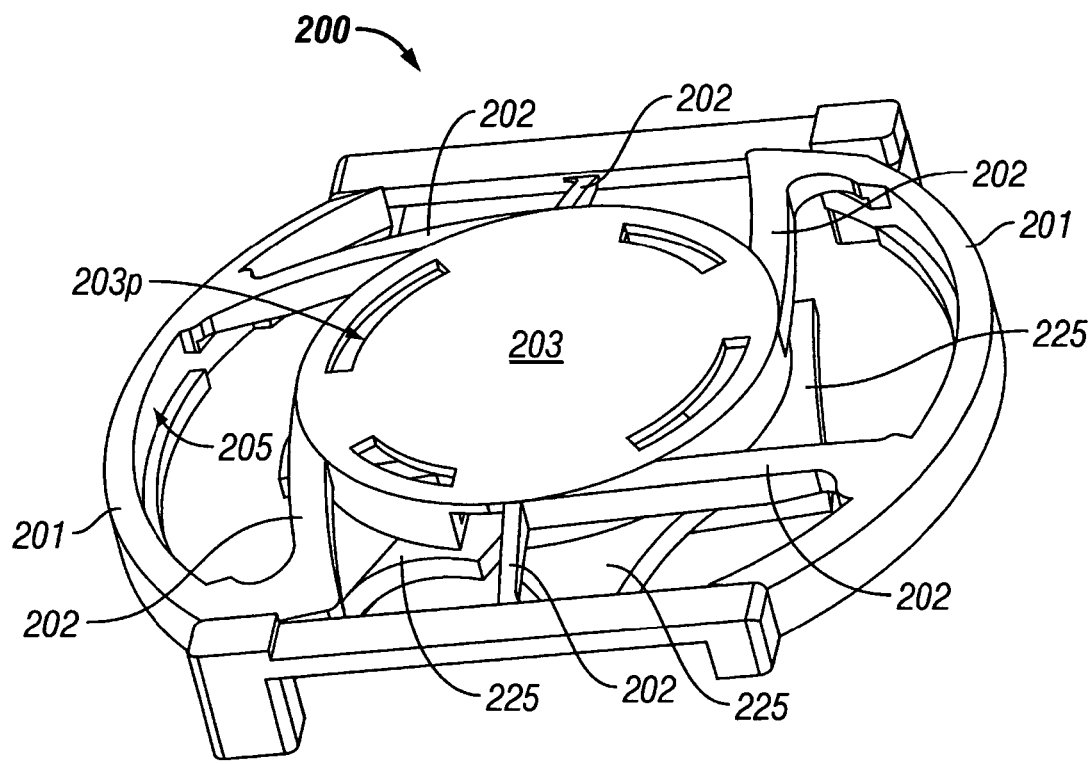

In FIGS. 13a and 13b, a fan mount 200 supports the stator 220 of the fan 210 and positions the stator 220 over the chamber 30 so that the fan blades 225 are positioned in the chamber 30. The fan mount 200 includes a vane clamp 201 and a platform 203 connected with the vane clamp 201 by a plurality of supports 202. The supports 202 can vary in size and shape. The stator 220 of the fan 210 is connected with the platform 203 by a stator clamp 207 (see FIG. 14c) with a portion of the stator clamp 207 positioned in the gap 223g between the stator 220 and the rotor 221. The platform 203 can include an opening 203o through which power leads (not shown) for the fan 210 can be routed to connect the power leads with a power supply. The platform 203 can also include one or more apertures 203p. The openings 203o and/or the apertures 203p can be designed for easy manufacturing of the fan mount 200 via a molding process to avoid the need to use side cores in a mold in which the fan mount 200 is formed. For example, the fan mount 200 can be formed using a plastic injection molding process.

The portion of the stator clamp 207 that is positioned in the gap 223g has a thickness that is less than the thickness $T_G$ to prevent a mechanical interference between the stator clamp 207 and the rotor 221 so that the rotor 221 can freely rotate R when the stator 220 is connected with the platform 203. A groove 208 (see FIG. 14c) in the platform 203 has a profile that complements the profile of the surface 220s of the stator 220. A width $W_G$ of the groove 208 should be slightly greater than the thickness $T_S$ of the surface 220s so that the stator 220 can be inserted into the groove 208. The profile of the groove 208 need not be planar as depicted and can include but is not limited to a sloped profile and an arcuate profile. Prior to connecting the vane clamp 201 to the vanes 23, the stator 220 can be inserted in the stator clamp 207 of the platform 203 and then fan mount 200 can be connected with the cooling device 20 by connecting the vane clamp 201 with the vanes 23.

Figure 13C:
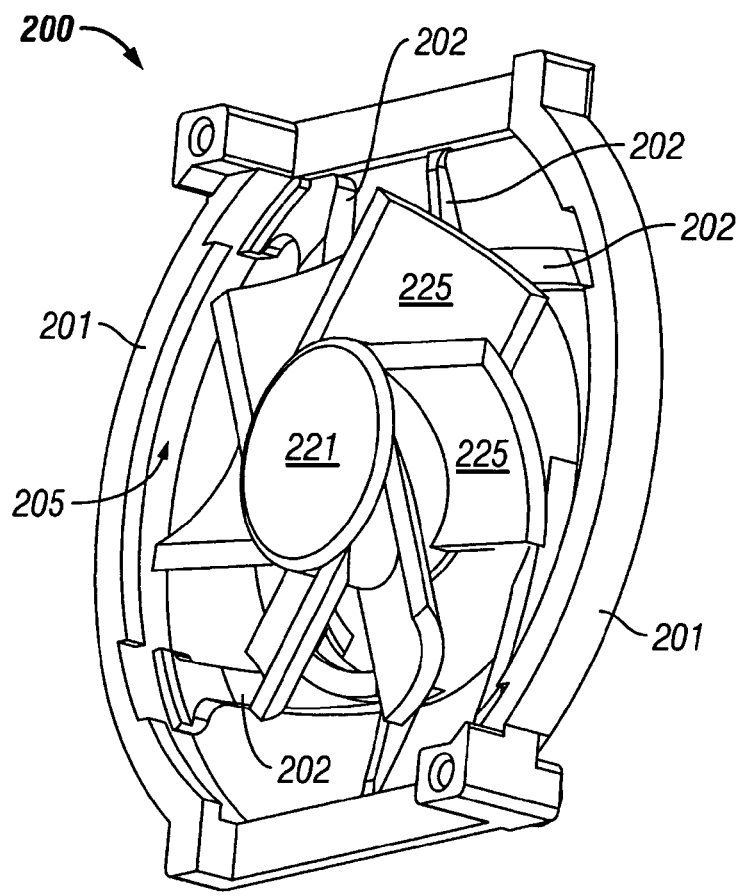

Turning to FIG. 13c, the vane clamp 201 connects with the top face 29 and the lip 22 of a plurality of the vanes 23 on the cooling device 20. The vane clamp 201 can include a groove 205 that has a profile that complements a profile of the top face 29 and the lip 22 on the vanes 23. With the vane clamp 201 connected with the vanes 23, at least a portion of the top face 29 and a lip 22 are positioned in the groove 205 (see FIGS. 18 and 19). Suitable materials for the fan mount 200 include but are not limited to plastics and metals, for example. Preferably, a flexible or semi-flexible plastic material is used for the fan mount 200 and the vane clamps 201 can be clamped to the vanes 23 by flexing the fan mount 200 to slightly spread the vane clamps 201 apart so that the groove 205 can be slipped onto the top face 29 and the lip 22 of a plurality of the vanes 23. Similarly, the stator 220 can be inserted into the platform 203 by flexing the fan mount 200. To aid in insertion, the surface 220s can have a sloped or an arcuate profile that can be urged against the stator clamp 207 to push the stator clamp 207 outward during the insertion so that the stator 220 slips or snaps into the groove 208.

Figure 14A:
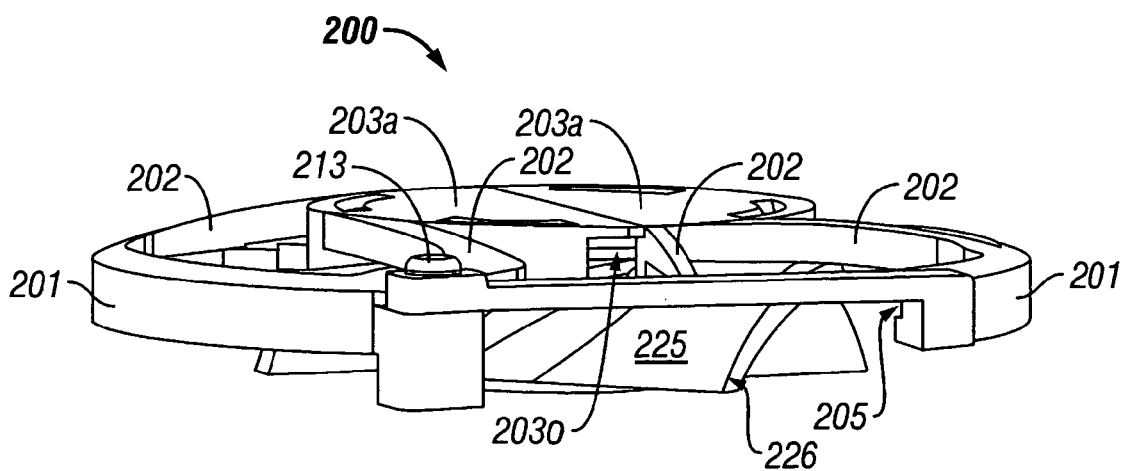
FIG. 14a is a side profile view depicting the fan of FIG. 12 connected with an alternative fan mount.
Figure 14B:
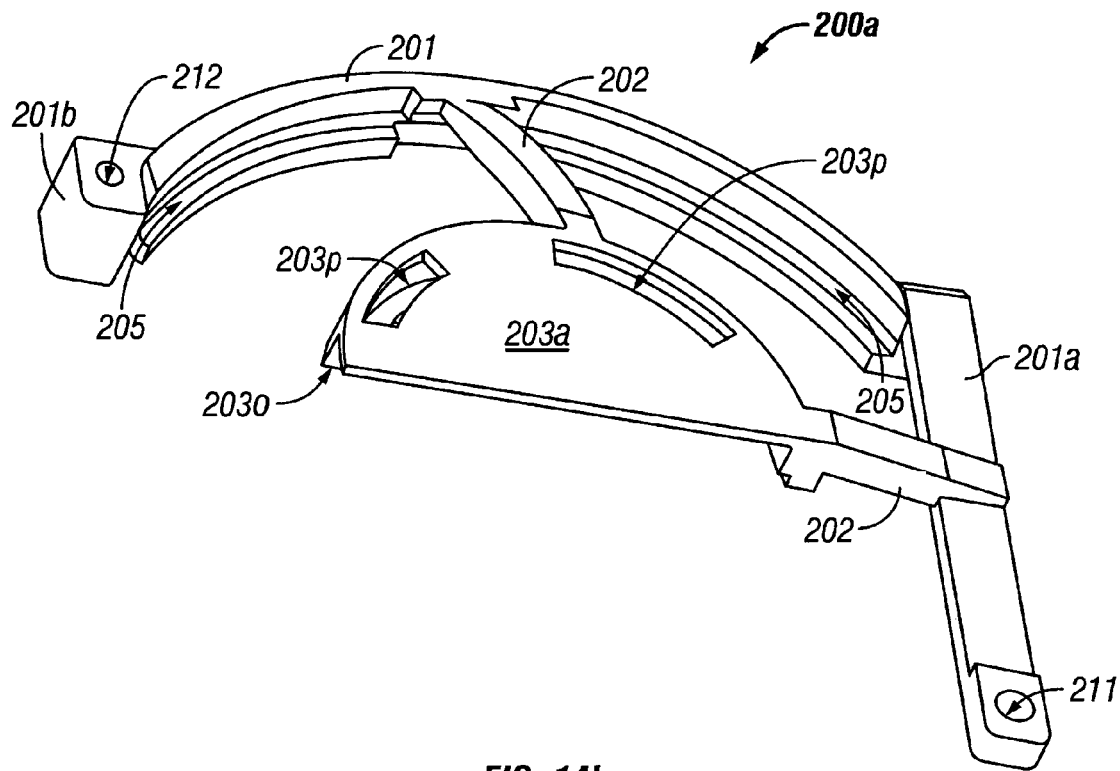
FIG. 14b is a top plan view depicting one section of a fan mount.
Figure 14C:
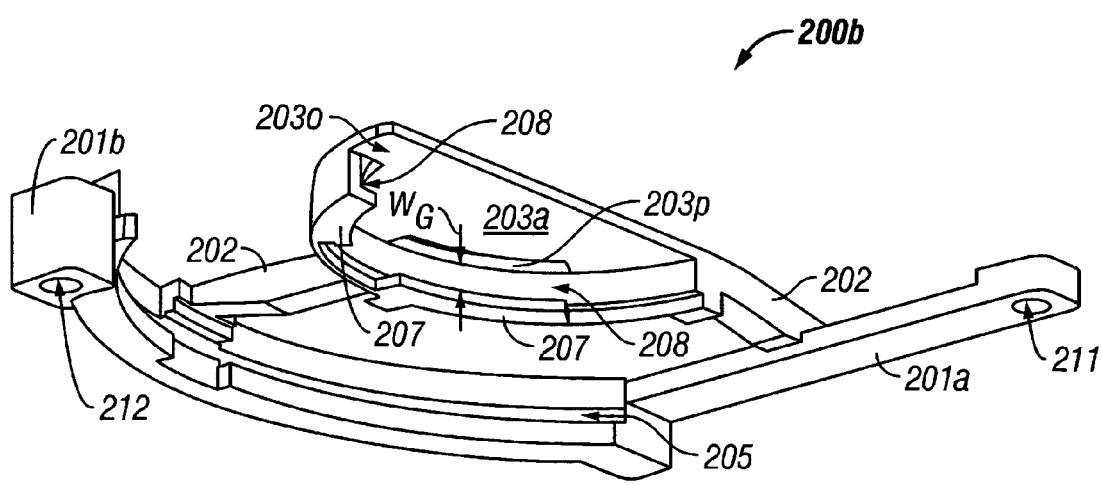
FIG. 14c is a bottom plan view depicting one section of a fan mount.

In FIGS. 14a through 14c, the fan mount 200 comprises a first section 200a and a second section 200b. Each section including a vane clamp 201, the groove 205, a platform 203a connected with the vane clamp 201 by at least one support 202, the stator clamp 207, and the groove 208. The vane clamp 201 also includes an arm 201a and a post 201b. The arm 201a can include an aperture 211 and the post 201b can include an aperture 212. The first and second sections (200a, 200b) can be connected with each other by placing the aperture 211 in the arm 201a over the aperture 212 in the post 201*b* and inserting a fastener 213 in the apertures (211, 212). The first and second sections (200*a*, 200*b*) can be identical and can be made from a material including but not limited to plastics and metal. A variety of methods including but not limited to using adhesives, gluing, brazing, soldering, welding, or ultrasonic welding can be used to connect the first and second sections (200*a*, 200*b*) to each other. For example, the apertures (211, 212) can be aligned with each other and a pin can be glued into the apertures (211, 212) or the portion of the arm 201*a* where the aperture 211 is positioned can be glued to the post 201*b*. Alternatively, an end portion of the arms 201*a* can be glued, welded, or adhesively connected to the posts 201*b*, for example.

Figure 15A:
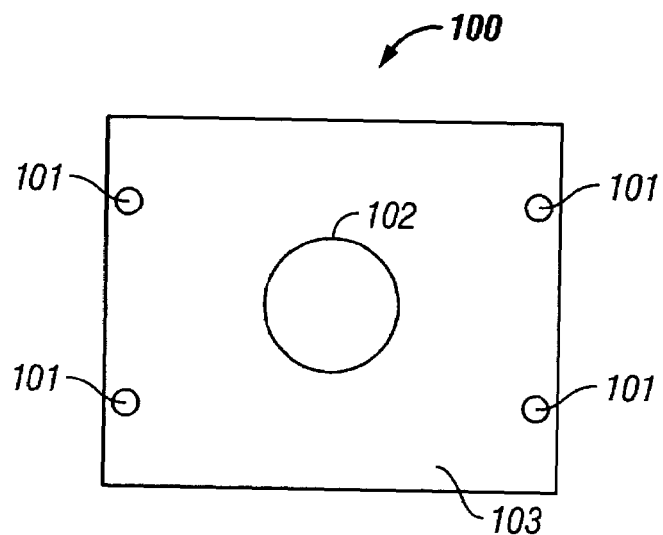
FIGS. 15a through 15c are top, cross-sectional, and profile views depicting a base plate.
Figure 15B:
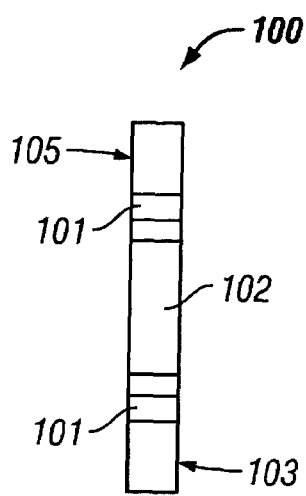
Figure 15C:
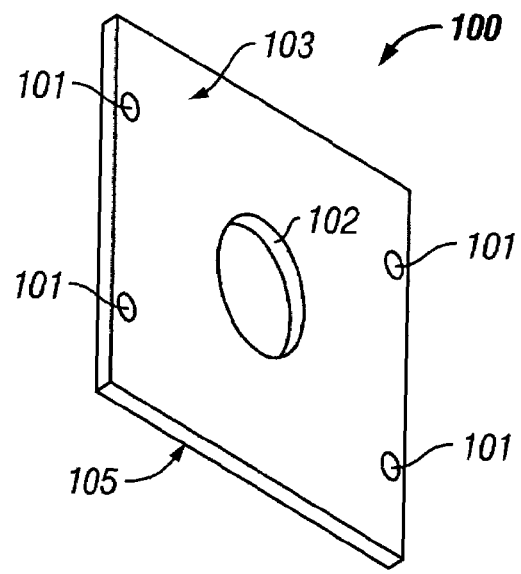

In FIGS. 15*a* through 15*c*, a base plate 100 includes a top surface 103, a bottom surface 105, and a base aperture 102 between the top and bottom surfaces (103, 105). The base plate 100 can include mounting holes 101 for receiving a fastener, such as a machine screw, for example. The fastener can be used to mount the base plate 100 on a PC board that carries the component 50 to be cooled by the cooling system 10. The base plate 100 positions the mounting surface 19 of the core 11 in thermal contact with the component 50. The base aperture 102 is adapted to receive the base 17 of the core 11. The base plate 100 can have any shape and is not limited to the rectangular shape depicted herein. The base plate 100 can have any shape that can accommodate a bore through which the cooling device 20 can be connected with the base plate 100. Suitable materials for the base plate 100 include but are not limited to a metal. For example, the base plate 100 can be made from aluminum (Al).

Figure 16:
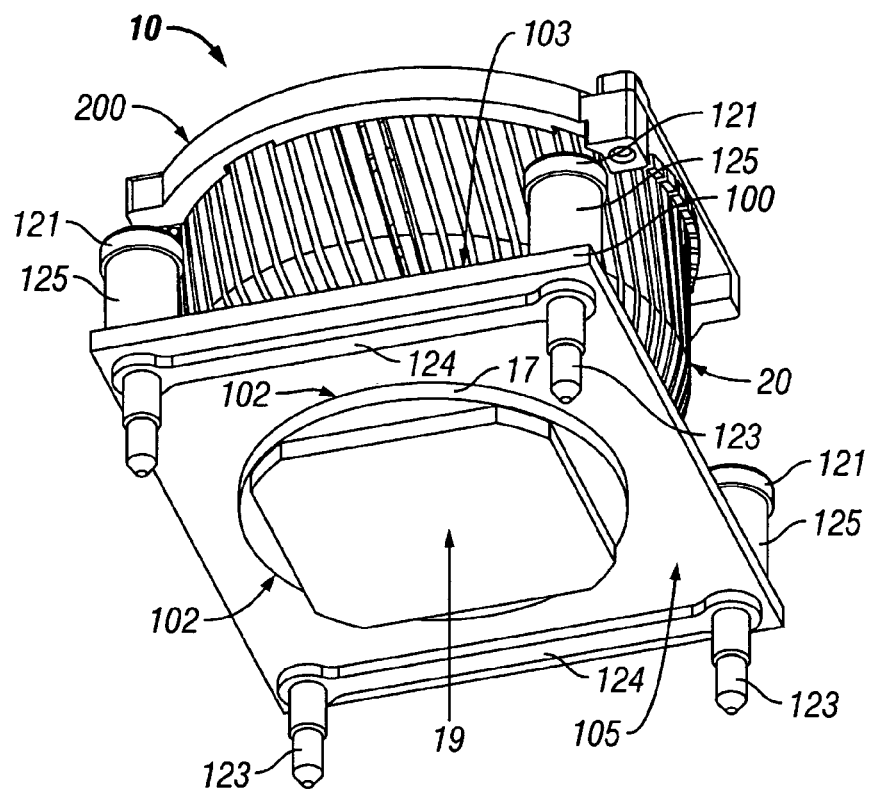
FIG. 16 is a bottom profile view depicting a cooling system including a cooling device connected with a base plate.

In FIG. 16, the cooling system 10 includes the base plate 100 connected with the cooling device 20. The base 17 of the cooling device 20 can be inserted into the base aperture 102 and then retained in the base aperture 102 by a variety of methods including but not limited to welding, friction stir welding, soldering, brazing, gluing, or by a friction fit between the base 17 and the base aperture 102. The mounting surface 19 may or may not be flush with the bottom surface 105. A fastener 121 can be inserted into the mounting holes 101 in the base plate 100 and retained there by a fastener retainer 124 positioned on the bottom surface 105. A spring 125 can be positioned between the fastener 121 and the top surface 103. When the cooling system 10 is mounted on the component 50, the spring 125 compresses and exerts a force on the component 50 that enhances heat transfer from the component 50 to the core 11. A substrate (not shown) such as a PC board or a mother board that carries the component 50 can include a threaded aperture that receives a threaded end 123 of the fastener 121.

The aforementioned thermal interface material 40 can be positioned on the mounting surface 19 prior to the cooling device 20 being connected to the base plate 100 or after the connection of the cooling device 20 to the base plate 100. The force generated by the springs 125 can also reduce thermal resistance between the component 50 and the core 11 by compressing the thermal interface material 40 thereby eliminating or reducing air gaps between the thermal interface material 40 and the surfaces (19, 51).

Figure 17:
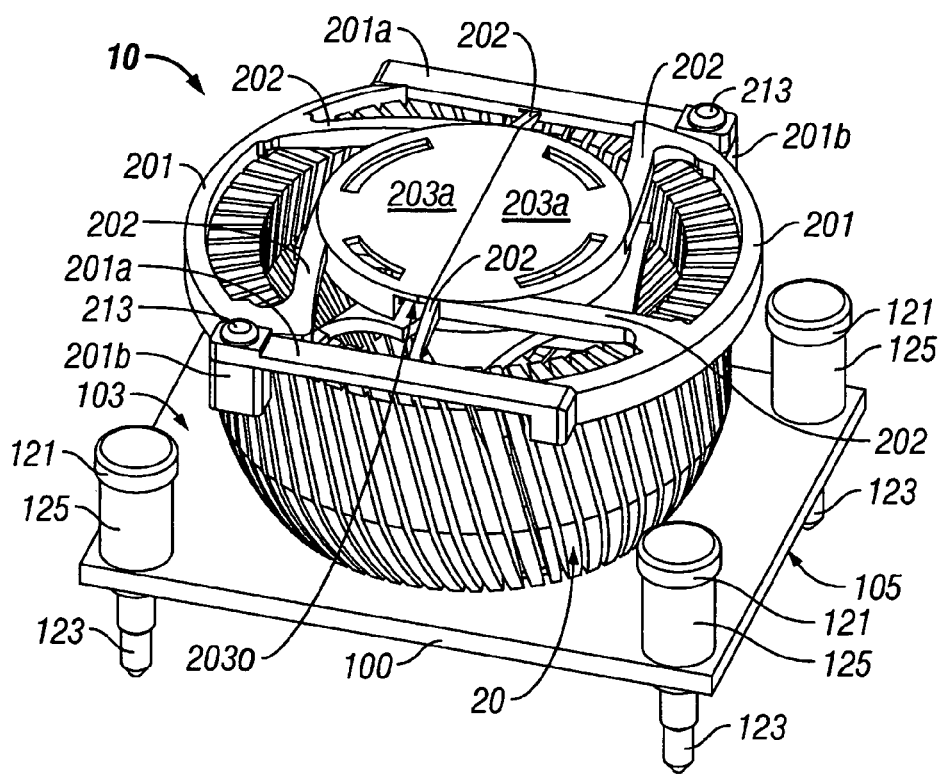
FIG. 17 is a top profile view depicting a cooling system.

Referring to FIG. 17, the first and second sections (200*a*, 200*b*) of the fan mount 200 are shown connected with each other using fasteners 213 and the vane clamps 201 are connected with the vanes 23 of the cooling device 20. An electrical connection to supply electrical power to the fan 210 can be supplied by wires routed through the opening 203*o*. When the first and second sections (200*a*, 200*b*) are connected to each other, the opening 203*o* can be duplicated on an opposing side of the fan mount 200. Therefore, the electrical connection can be made on one side only or on both sides. After the fan mount 200 is connected with the cooling device 20, the fan blades 225 are positioned in the chamber 30. The supports 202 that connect the platforms 203*a* with the vane clamps 201 are preferably as small is practicable so that they have a minimum surface area substantially normal to the air flows ($F_F$, $F_R$). The minimum surface area provides a larger opening over the chamber 30 for the air flows ($F_F$, $F_R$) to exit the chamber 30 and reduces air turbulence noise caused by the air flows ($F_F$, $F_R$) passing over the supports 202.

As one example of how the fan mount 200 can be assembled and connected with the cooling device 20, the stator 220 of the fan 210 can be inserted into the stator clamp 207 of one of the platforms 203*a* of one of the sections 200*a* or 200*b*. The surface 220*s* will be positioned in the groove 208 with the stator clamp 207 positioned in the gap 223*g* between the stator 220 and the rotor 221. The section with the fan 210 has its vane clamp 201 connected with the top face 29 and the lip 22 of the vanes 23 so that the section is connected with the cooling device 20. The remaining section, either 201*a* or 201*b*, is connected with the top face 29 and the lip 22 of the vanes 23 while urging the stator clamp 207 into the gap 223*g* so that a remaining portion of the stator 220 is connected with the platform 203*a* with the surface 220*s* positioned in the groove 208. The first and second sections (200*a*, 200*b*) can then be connected as was described above. For example, the fasteners 213 can be inserted into the apertures (211, 212).

Figure 18:
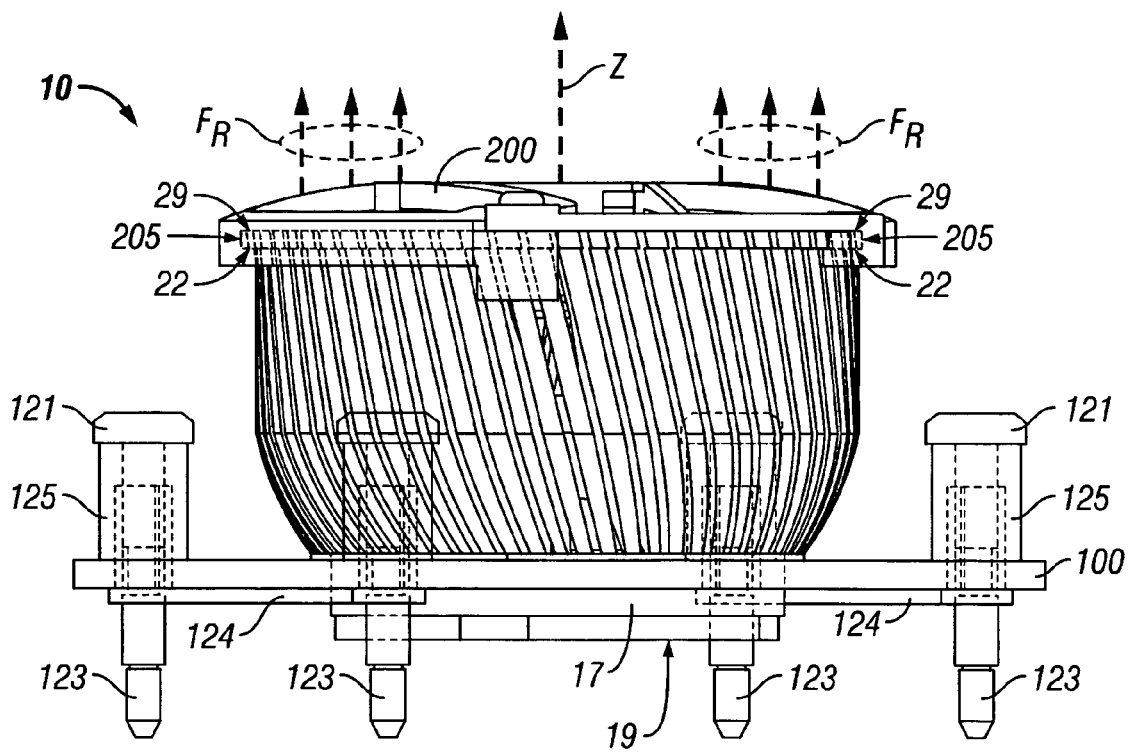
FIG. 18 is a side profile view depicting a cooling system.
Figure 19:
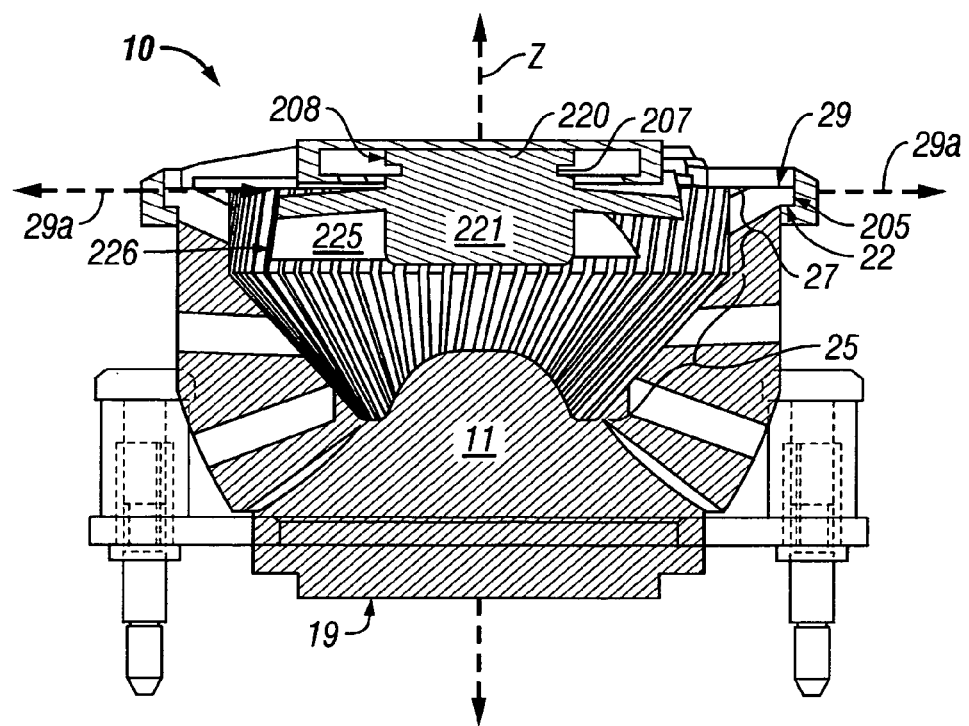
FIG. 19 is a cross-sectional view depicting a cooling system.

Turning to FIG. 18, the connection between the vane clamps 201 and the top face 29 and the lip 22 are depicted in greater detail. The lip 22 and a portion of the top face 29 of the vanes 23 are positioned in the groove 205 to connect the fan mount 200 to the cooling device 20. In FIG. 19, the fan blades 225 are positioned entirely within the chamber 30 and below the plane of the dashed line 29*a* so that the fan blades 225 are completely submerged in the chamber 30. Even though the fan blades 225 are completely submerged a portion of the rotor 221 may be positioned outside of the chamber 30. For example, a portion of the rotor 221 may be positioned above the line 29*a*. Preferably, an axis of rotation $R_A$ of the rotor 221 is substantially aligned with the axis Z of the core 11 so that the fan 210 is substantially symmetrically centered in the chamber 30.

Preferably, the core 11, the base 17, and the fins 21 are homogeneously formed, that is, the core 11, the base 17, and the fins 21 are a unitary whole formed from the same piece of material. An extrusion process can be used to homogeneously form the core 11, the base 17, and the fins 21. The cooling device 20 can be made from a variety of thermally conductive materials including but not limited to copper (Cu), electrolytic copper (Cu), aluminum (Al), and alloys of aluminum and copper, ceramics, and silicon (Si) substrates. An exemplary material for the cooling device 20 is an aluminum 1060 or an aluminum 6063.

The cooling device 20 can be manufactured by a variety of processes including but not limited to those listed below. First, the cooling device 20 can completely machining from an extruded bar stock. Second, a diecasting, forging, or pressing process can be used to form either one or both of the leading and trailing edges (32, 26) of the cooling device 20, followed by a machining process to form the base 17, the mounting surface 19, the projections 19*p*, the cylindrical neck 18, and the attachment groove 18*g*. Next cutting wheels can be used to form the slots (S1, S2) slots for the fins 21 and the vanes 23 respectively, followed by a deburring and a degreasing process. Third, impact forging the complete cooling device 20 including the fins 21 and vanes 23. Fourth, pressure diecasting the complete cooling device 20 including the fins 21 and vanes 23.

The fan mount 200 in FIGS. 13a through 13c or the or the first and second sections (200a, 200b) of the fan mount 200 in FIGS. 14a through 14c can be formed using an injection molding process, for example. An exemplary material for the fan mount 200 is plastic because it can be injection molded, is low in cost, and is electrically nonconductive. If a plastic material is used, then the material should be selected to withstand an expected temperature range of the cooling device 20. In FIGS. 4a and 5, some of the vanes 23 can have a notch 41 formed therein and the vane clamps 201 can include a key with a profile that complements the notch 41. The key is inserted into the notch 41 when the vane clamps 201 are connected with the vanes 23 as described above. The key and the notch 41 can prevent the fan mount 200 from rotating or twisting after being mounted to the cooling device 20 and/or to align the fan mount 200 with the cooling device 20 in a predetermined orientation.

Although several embodiments of the present invention have been disclosed and illustrated, the invention is not limited to the specific forms or arrangements of parts so described and illustrated. The invention is only limited by the claims.

What is claimed is:

1. A cooling system for dissipating heat from a component, comprising:
    a cooling device including a core and a plurality of fins connected with the core, the fins are spaced apart to define a first slot therebetween,
    the core including a boss, a base, and a mounting surface for thermally connecting the core with the component,
    each fin including a leading edge, a trailing edge with the trailing edges defining a chamber, and a second slot extending through a portion of each fin to define a plurality of vanes in each fin with each vane including a top face and a lip;
    a fan for generating a selected one of a reverse air flow or a forward air flow, the fan including, a stator, a rotor connected with the stator, a gap between the stator and the rotor, and a plurality of fan blades connected with the rotor; and
    a fan mount for supporting the stator and positioning the stator over the chamber so that the fan blades are positioned in the chamber, the fan mount including a vane clamp operative to connect with the top face and the lip of a plurality of the vanes, a platform connected with the vane clamp by a plurality of supports, the platform including a stator clamp for connecting the stator with the platform, and a portion of the stator clamp is positioned in the gap between the rotor and the stator.

2. The cooling system as set forth in claim 1, wherein the fan blades have a position in the chamber selected from the group consisting of a position that is entirely in the chamber and a position that is partially in the chamber.

3. The cooling system as set forth in claim 1, wherein the first slot between the fins extends to the core.

4. The cooling system as set forth in claim 1 and further comprising a thermal interface material positioned on the mounting surface.

5. The cooling system as set forth in claim 1, wherein the mounting surface includes a cavity inset from the mounting surface and adapted to receive a thermal interface material.

6. The cooling system as set forth in claim 5 and further comprising a thermal interface material positioned in the cavity.

7. The cooling system as set forth in claim 1, wherein the mounting surface further comprises:
    a plurality of projections that extend outward of the mounting surface.

8. The cooling system as set forth in claim 1, wherein the core, the base, and the fins are a homogeneously formed unitary whole.

9. The cooling system as set forth in claim 1, wherein the fins are tangentially oriented to a predetermined diameter of a circle centered about an axis of the core.

10. The cooling system as set forth in claim 9, wherein the predetermined diameter is from about 3.0 millimeters to about 12.0 millimeters.

11. The cooling system as set forth in claim 1, wherein the fins are inclined at an angle with respect an axis of the core.

12. The cooling system as set forth in claim 11, wherein the angle at which the fins are inclined is from about 5.0 degrees to about 25.0 degrees.

13. The cooling system as set forth in claim 1, wherein the boss includes a surface profile selected from the group consisting of an arcuate profile, a sloped profile, and a composite profile.

14. The cooling system as set forth in claim 13, wherein the surface profile of the boss includes a frustum.

15. The cooling system as set forth in claim 1, wherein the leading edges of the fins include a profile selected from the group consisting of a planar profile, an arcuate profile, a sloped profile, and a composite profile.

16. The cooling system as set forth in claim 1, wherein the trailing edges of the fins include a profile selected from the group consisting of a planar profile, an arcuate profile, a sloped profile, and a composite profile.

17. The cooling system as set forth in claim 16, wherein an outer edge of the fan blade includes a profile that compliments at least a portion of the profile of the trailing edges of the fins.

18. The cooling system as set forth in claim 1 and further comprising:
    a base plate including a top surface, a bottom surface and a base aperture extending between the top and bottom surfaces and the base of the core is positioned in the base aperture.

19. The cooling system as set forth in claim 18, wherein the base plate further comprises a plurality of mounting holes extending between the top and bottom surfaces and adapted to receive a fastener.

20. The cooling system as set forth in claim 1, wherein an axis of rotation of the rotor is substantially aligned with an axis of the core.

21. The cooling system as set forth in claim 1, wherein the fan mount comprises a first section connected with a second section, each section including a vane clamp operative to connect with the top face and the lip of a plurality of the vanes, a platform connected with the vane clamp by a plurality of supports, the vane clamps including an arm and a post, and the platform including a stator clamp for connecting the stator with the platform with a portion of the stator clamp positioned in the gap between the rotor and the stator.

22. The cooling system as set forth in claim 21 and further comprising:
    an aperture in the arm of the first section and an aperture in the post of the first section; and an aperture in the arm of the second section and an aperture in the post of the second section, and wherein the apertures in the arms are aligned with the apertures in the posts so that the first section can be connected with the second section by inserting a fastener in the apertures.

23. The cooling system as set forth in claim 21, wherein the first and second sections are connected to each other using a process selected from the group consisting of gluing, adhesively connecting, brazing, soldering, welding, and ultrasonic welding.

24. The cooling system as set forth in claim 21, wherein the first and second sections are identical to each other.

25. The cooling system as set forth in claim 21, wherein an axis of rotation of the rotor is substantially aligned with an axis of the core.

26. The cooling system as set forth in claim 1, wherein the second slot between the vanes extends to the core.

27. The cooling system as set forth in claim 1, wherein the boss further includes a groove positioned between the boss and the trailing edges of the fins and the groove including a profile that blends with a profile of the boss and with a profile of the trailing edges of the fins.

* * * * *